United States Patent
Kim et al.

(10) Patent No.: US 11,393,851 B2
(45) Date of Patent: *Jul. 19, 2022

(54) DISPLAY DEVICE HAVING A PLURALITY OF PAD TERMINALS INCLUDING CONNECTION PAD TERMINALS AND DUMMY PAD TERMINALS

(71) Applicant: Samsung Display Co., Ltd., Yongin-si (KR)

(72) Inventors: Byoung Yong Kim, Seoul (KR); Jong Hyuk Lee, Seoul (KR); Jeong Ho Hwang, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/809,920

(22) Filed: Mar. 5, 2020

(65) Prior Publication Data

US 2020/0203390 A1   Jun. 25, 2020

Related U.S. Application Data

(63) Continuation of application No. 15/688,096, filed on Aug. 28, 2017, now Pat. No. 10,600,819.

(30) Foreign Application Priority Data

Sep. 9, 2016   (KR) .................. 10-2016-0116733

(51) Int. Cl.
*H01L 27/12*   (2006.01)
*G02F 1/1345*   (2006.01)
(Continued)

(52) U.S. Cl.
CPC ...... *H01L 27/1244* (2013.01); *G02F 1/13452* (2013.01); *G02F 1/13458* (2013.01);
(Continued)

(58) Field of Classification Search
CPC ..... H01L 27/1244; H01L 24/05; H01L 24/06; H01L 27/3276; H01L 2224/05018;
(Continued)

(56) References Cited

U.S. PATENT DOCUMENTS

| 5,592,365 A | * | 1/1997 | Sugimoto | H05K 3/323 361/789 |
| 2002/0030658 A1 | * | 3/2002 | Kim | G02F 1/1345 345/92 |

(Continued)

FOREIGN PATENT DOCUMENTS

| KR | 10-2016-0029226 | 3/2016 |
| KR | 10-2016-0052988 | 5/2016 |

OTHER PUBLICATIONS

Non-Final Office Action dated May 17, 2018, in U.S. Appl. No. 15/688,096.

(Continued)

*Primary Examiner* — Nduka E Ojeh
*Assistant Examiner* — Laura M Dykes
(74) *Attorney, Agent, or Firm* — H.C. Park & Associates, PLC

(57) ABSTRACT

A display device includes a substrate including a display area to display an image and a pad area positioned around the display area; a first pad unit disposed on the pad area, and including a first terminal region having a plurality of first pad terminals arranged in a first direction; and a printed circuit board including a base film and a second pad unit positioned at one side of the base film, the second pad unit being coupled with the first pad unit by electrically connecting with the plurality of first pad terminals. Each of the plurality of first pad terminals includes: at least three first connection pad terminals arranged in a first row disposed at a first angle larger than 0° and smaller than 90° relative to the first direction, the plurality of first connection pad (Continued)

terminals being in electrically connecting with the second pad unit of the printed circuit board through a plurality of conductive balls; a plurality of second connection pad terminals spaced apart from the plurality of first connection pad terminals, and arranged in a second row disposed at a second angle larger than 0° and smaller than 90° relative to the first direction, the plurality of second connection pad terminals being in electrically connecting with the second pad unit of the printed circuit board through another plurality of conductive balls; and a plurality of first dummy pad terminals disposed between pairs of adjacent first connection pad terminals of the first connection pad terminals.

32 Claims, 25 Drawing Sheets

(51) Int. Cl.
*H01L 23/00* (2006.01)
*H01L 27/32* (2006.01)

(52) U.S. Cl.
CPC .............. *H01L 24/05* (2013.01); *H01L 24/06* (2013.01); *H01L 27/3276* (2013.01); *H01L 2224/05018* (2013.01); *H01L 2224/05082* (2013.01); *H01L 2224/05083* (2013.01); *H01L 2224/05084* (2013.01); *H01L 2224/06133* (2013.01); *H01L 2224/06135* (2013.01)

(58) Field of Classification Search
CPC . H01L 2224/05082; H01L 2224/05083; H01L 2224/05084; H01L 2224/06133; H01L 2224/06135; H01L 51/0031; H01L 51/5203; G02F 1/13452; G02F 1/13458; G09F 9/33; G09G 3/3208; G09G 2300/0426; G01R 31/2825; H05K 1/118
See application file for complete search history.

(56) References Cited

U.S. PATENT DOCUMENTS

| | | |
|---|---|---|
| 2007/0109485 A1 | 5/2007 | Eguchi et al. |
| 2008/0030668 A1 | 2/2008 | Komaju |
| 2008/0204618 A1 | 8/2008 | Jung et al. |
| 2010/0201661 A1 | 8/2010 | Kimura et al. |
| 2010/0208154 A1 | 8/2010 | Ahn |
| 2011/0193239 A1* | 8/2011 | Horiguchi .............. H05K 1/111 257/773 |
| 2012/0112199 A1 | 5/2012 | Son et al. |
| 2015/0181701 A1 | 6/2015 | Li |
| 2015/0187803 A1 | 7/2015 | Moh et al. |
| 2015/0230329 A1 | 8/2015 | Hareyama |
| 2015/0230331 A1 | 8/2015 | Lee |
| 2016/0066409 A1 | 3/2016 | Kwon et al. |
| 2018/0020550 A1* | 1/2018 | Jang ....................... H05K 1/111 |

OTHER PUBLICATIONS

Final Office Action dated Jan. 7, 2019, in U.S. Appl. No. 15/688,096.
Advisory Action dated Apr. 4, 2019, in U.S. Appl. No. 15/688,096.
Non-Final Office Action dated May 15, 2019, in U.S. Appl. No. 15/688,096.
Notice of Allowance dated Nov. 5, 2019, in U.S. Appl. No. 15/688,096.

* cited by examiner

DISPLAY DEVICE HAVING A PLURALITY OF PAD TERMINALS INCLUDING CONNECTION PAD TERMINALS AND DUMMY PAD TERMINALS

CROSS-REFERENCE TO RELATED APPLICATIONS

This application is a Continuation of U.S. patent application Ser. No. 15/688,096, filed Aug. 28, 2017, which claims priority from and the benefit of Korean Patent Application No. 10-2016-0116733, filed on Sep. 9, 2016, which is hereby incorporated by reference for all purposes as if fully set forth herein.

BACKGROUND

Field

The invention relates generally to a display device, and more particularly, to a display device in which a large number of pad terminals are accommodated in a non display area of the device.

DISCUSSION OF THE BACKGROUND

Currently known display devices include a liquid crystal display (LCD), a plasma display panel (PDP), an organic light emitting diode (OLED) display, a field emission display (FED), and an electrophoretic display device.

Particularly, an OLED device includes two electrodes and an organic emission layer interposed therebetween. Electrons injected from one electrode and holes injected from the other electrode are bonded to one another in the organic emission layer to form excitons, and light is emitted while the excitons discharge energy.

The OLED device has self-luminance characteristics and does not require a separate light source, unlike an LCD, and thus can have decreased thickness and weight. Further, the OLED device exhibits high quality characteristics, such as low power consumption, high luminance, and a high response rate, thereby attracting attentions as a next generation display device.

In order to drive an organic light emitting diode of the OLED device, a printed circuit board is coupled to a peripheral area of the substrate, and a signal required for driving the organic light emitting diode is received through the printed circuit board.

However, following the development of display devices with high resolution, the number of pad terminals coupled with the printed circuit board and their associated connection lines have been increased. When the number of lines connected to the pad terminals increase, the spacing between the lines decrease and density of the lines per unit area increases.

The above information disclosed in this Background section is only for enhancement of understanding of the background of the inventive concepts, and, therefore, it may contain information that does not form prior art.

SUMMARY

Applicants have discovered that as the density of the pad terminals and their connecting lines increase, interference between the lines, such the resistance of some of the lines, increases, which may result in short circuits and a decrease in the performance of the display device, e.g., a decrease in luminance.

Display devices constructed according to the principles of the invention can accommodate a large number of pad terminals and associated connecting lines in a peripheral area of the display while minimizing the likelihood of lines being short-circuited within a pad terminal and the attendant decrease in performance characteristics, such as luminance.

Additional aspects will be set forth in the detailed description which follows, and, in part, will be apparent from the disclosure, or may be learned by practice of the inventive concept.

According to one aspect of the invention, a display device includes a substrate including a display area to display an image and a pad area positioned around the display area; and a first pad unit disposed on the pad area, and including a first terminal region having a plurality of first pad terminals arranged in a first direction, in which each of the plurality of first pad terminals includes: a plurality of first connection pad terminals arranged in a first row disposed at a first angle relative to the first direction; a plurality of second connection pad terminals spaced apart from the plurality of first connection pad terminals, and arranged in a second row disposed at a second angle relative to the first direction; and a first terminal connection line configured to connect one of the plurality of first connection pad terminals and one of the plurality of second connection pad terminals, and having at least one bent shape. The first terminal connection line is disposed in a different layer from that of the first connection pad terminal and the second connection pad terminal.

A plurality of data lines and a plurality of gate lines intersecting the plurality of data lines may be disposed in the display area of the substrate.

At least one of the plurality of first connection pad terminals and the plurality of second connection pad terminals may be disposed in the same layer as that of the plurality of data lines, and the plurality of first terminal connection lines may be disposed in the same layer as that of the plurality of gate lines.

The plurality of gate lines may include a plurality of first gate members and a plurality of second gate members disposed on the plurality of first gate members, and the plurality of first terminal connection lines may be disposed in the same layer as that of any one of the plurality of first gate members and the plurality of second gate members.

The display device may further include a plurality of first connection lines disposed in the pad region to connect the display area and the plurality of first connection pad terminals.

The plurality of first connection lines may be disposed in the same layer as that of the plurality of data lines.

The plurality of first connection lines may be disposed in the same layer as that of the plurality of gate lines.

The plurality of gate lines may include a plurality of first gate members and a plurality of second gate members disposed on the first gate member, and the plurality of first connection lines may be disposed in the same layer as that of any one of the plurality of first gate members and the plurality of second gate members.

The display device may further include a plurality of first test lines connected to the plurality of second connection pad terminals, respectively, and extending to an end portion of one side of the substrate.

The plurality of first test lines may be disposed in the same layer as that of the plurality of data lines.

The plurality of first test lines may be disposed in the same layer as that of the plurality of gate lines.

The plurality of gate line may include a plurality of first gate members and a plurality of second gate members disposed on the first gate member, and the plurality of first test lines may be disposed in the same layer as that of any one of the plurality of first gate members and the plurality of second gate members.

The first angle may be substantially the same as the second angle.

Each of the first angle and the second angle may be larger than 0° and smaller than 90°.

The first pad unit may further include a second terminal region having a plurality of second pad terminals spaced apart from the first terminal region.

Each of the plurality of second pad terminals may include: a plurality of third connection pad terminals arranged in a third row disposed at a third angle relative to the first direction; and a plurality of fourth connection pad terminals spaced apart from the plurality of third connection pad terminals, and arranged in a fourth row disposed at a fourth angle relative to the first direction.

The third angle may be substantially the same as the fourth angle.

Each of the third angle and the fourth angle may be larger than 0° and smaller than 90°.

The third angle may be substantially the same as the first angle.

The display device may further include a plurality of second test lines connected to the plurality of fourth connection pad terminals, respectively, and extending to an end portion of one side of the substrate.

Each of the plurality of first connection pad terminals and the plurality of second connection pad terminals may have a plate-like, quadrangular shape.

The quadrangular shape is defined at least in part by a first side parallel to the first direction, and a second side adjacent to the first side and parallel to a second direction intersecting the first direction, and the second side may be longer than the first side.

The display device may further include: a printed circuit board including a base film and a second pad unit positioned at one side of the base film, the second pad unit having a shape substantially corresponding to that of the first pad unit and being coupled with the first pad unit, in which the second pad unit includes a plurality of first contact terminals coupled with the plurality of first pad terminals, and each of the plurality of first contact terminals may include: a plurality of first contact pad terminals arranged in a fifth row disposed at the first angle relative to the first direction; and a plurality of second contact pad terminals spaced apart from the plurality of first contact pad terminals, and arranged in a sixth row disposed at a second angle relative to the first direction.

The printed circuit board may further include a plurality of first terminal lines disposed on the base film, and the plurality first terminal lines may be electrically connected with the plurality of first contact pad terminals disposed under the base film by a plurality of first contact holes passing through the base film.

The plurality of first contact holes may overlap the plurality of first contact pad terminals, respectively.

According to another aspect of the invention, a display device includes: a substrate including a display area to display an image and a pad area positioned around the display area; a first pad unit disposed on the pad area, and including a first terminal region having a plurality of first pad terminals arranged in a first direction; and a printed circuit board including a base film and a second pad unit positioned at one side of the base film, the second pad unit being coupled with the first pad unit by electrically connecting with the plurality of first pad terminals. Each of the plurality of first pad terminals includes: at least three first connection pad terminals arranged in a first row disposed at a first angle larger than 0° and smaller than 90° relative to the first direction, the plurality of first connection pad terminals being in electrically connecting with the second pad unit of the printed circuit board through a plurality of conductive balls; a plurality of second connection pad terminals spaced apart from the plurality of first connection pad terminals, and arranged in a second row disposed at a second angle larger than 0° and smaller than 90° relative to the first direction, the plurality of second connection pad terminals being in electrically connecting with the second pad unit of the printed circuit board through another plurality of conductive balls; and a plurality of first dummy pad terminals disposed between pairs of adjacent first connection pad terminals of the first connection pad terminals.

A first one of the first dummy pad terminals may be disposed between a first one of the first connection pad terminals and a second one of the first connection pad terminals, and a second one of the first dummy pad terminals may be disposed between the second one of the first connection pad terminals and a third one of the first connection pad terminals.

The first connection pad terminals and the first dummy pad terminals may be arranged to be parallel to one another, and the first connection pad terminals and the first dummy pad terminals may be serially arranged along the first row.

The first dummy pad terminals may be floated without receiving a signal.

The display device may include: a plurality of second dummy pad terminals disposed between pairs of adjacent second connection pad terminals of the second connection pad terminals.

A first one of the second dummy pad terminals may be disposed between a first one of the second connection pad terminals and a second one of the second connection pad terminals, and a second one of the second dummy pad terminals may be disposed between the second one of the second connection pad terminals and a third one of the second connection pad terminals.

The second connection pad terminals and the second dummy pad terminals may be arranged to be parallel to one another, and the second connection pad terminals and the second dummy pad terminals may be serially arranged along the second row.

The second dummy pad terminals may be floated without receiving a signal.

The display device may further include: a plurality of first terminal connection lines configured to connect one of the plurality of first connection pad terminals and one of the plurality of second connection pad terminals, and having at least one bent shape. The first terminal connection line may be disposed in a different layer from that of the first connection pad terminal and the second connection pad terminal.

A plurality of data lines and a plurality of gate lines crossing the plurality of data lines may be disposed in the display area of the substrate.

At least one of the plurality of first connection pad terminals and the plurality of second connection pad terminals may be disposed in a same layer as that of the plurality of data lines, and the plurality of first terminal connection lines may be disposed in a same layer as that of the plurality of gate lines.

The plurality of gate lines may include a plurality of first gate members and a plurality of second gate members disposed on the plurality of first gate members, and the plurality of first terminal connection lines may be disposed in a same layer as that of any one of the plurality of first gate members and the plurality of second gate members.

The display device may further include: a plurality of first connection lines disposed in the pad area to connect the display area and the plurality of first connection pad terminals.

The plurality of first connection lines may be disposed in a same layer as that of the plurality of data lines.

The plurality of first connection lines may be disposed in a same layer as that of the plurality of gate lines.

The plurality of gate lines include a plurality of first gate members and a plurality of second gate members disposed on the plurality of first gate members, and the plurality of first connection lines may be disposed in a same layer as that of any one of the plurality of first gate members and the plurality of second gate members.

The display device may further include: a plurality of first test lines connected to the plurality of second connection pad terminals, respectively, and extending to an end portion of one side of the substrate.

The plurality of first test lines may be disposed in a same layer as that of the plurality of data lines.

The plurality of first test lines may be disposed in a same layer as that of the plurality of gate lines.

The plurality of gate lines may include a plurality of first gate members and a plurality of second gate members disposed on the plurality of first gate members, and the plurality of first test lines may be disposed in a same layer as that of any one of the plurality of first gate members and the plurality of second gate members.

The first angle may be substantially same as the second angle.

The first pad unit may further include a second terminal region having a plurality of second pad terminals spaced apart from the first terminal region.

Each of the plurality of second pad terminals may include: a plurality of third connection pad terminals arranged in a third row disposed at a third angle relative to the first direction; and a plurality of fourth connection pad terminals spaced apart from the plurality of third connection pad terminals, and arranged in a fourth row disposed at a fourth angle relative to the first direction.

The third angle may be substantially same as the fourth angle.

Each of the third angle and the fourth angle may be larger than 0° and smaller than 90°.

The third angle may be substantially same as the first angle.

The display device may further include: a plurality of second test lines connected to the plurality of fourth connection pad terminals, respectively, and extending to an end portion of one side of the substrate.

Each of the plurality of first connection pad terminals and the plurality of second connection pad terminals may have a plate-like, quadrangular shape.

The quadrangular shape may be defined at least in part by a first side parallel to the first direction, and a second side adjacent to the first side and parallel to a second direction crossing the first direction, and the second side may be longer than the first side.

The second pad unit may have a shape substantially corresponding to that of the first pad unit and, may include a plurality of first contact terminals coupled with the plurality of first pad terminals, and each of the plurality of first contact terminals may include: a plurality of first contact pad terminals arranged in a fifth row disposed at the first angle relative to the first direction; and a plurality of second contact pad terminals spaced apart from the plurality of first contact pad terminals, and arranged in a sixth row disposed at the second angle relative to the first direction.

The printed circuit board may further include a plurality of first terminal lines disposed on the base film, and the plurality of first terminal lines are electrically connected with the plurality of first contact pad terminals disposed under the base film by a plurality of first contact holes passing through the base film.

The plurality of first contact holes may overlap the plurality of first contact pad terminals, respectively.

Accordingly, display devices constructed according to the principles of the invention may accommodate a large number of pad terminals in a peripheral area of the device.

Further, exemplary embodiments of the invention can prevent lines within the pad terminal from being short circuited.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
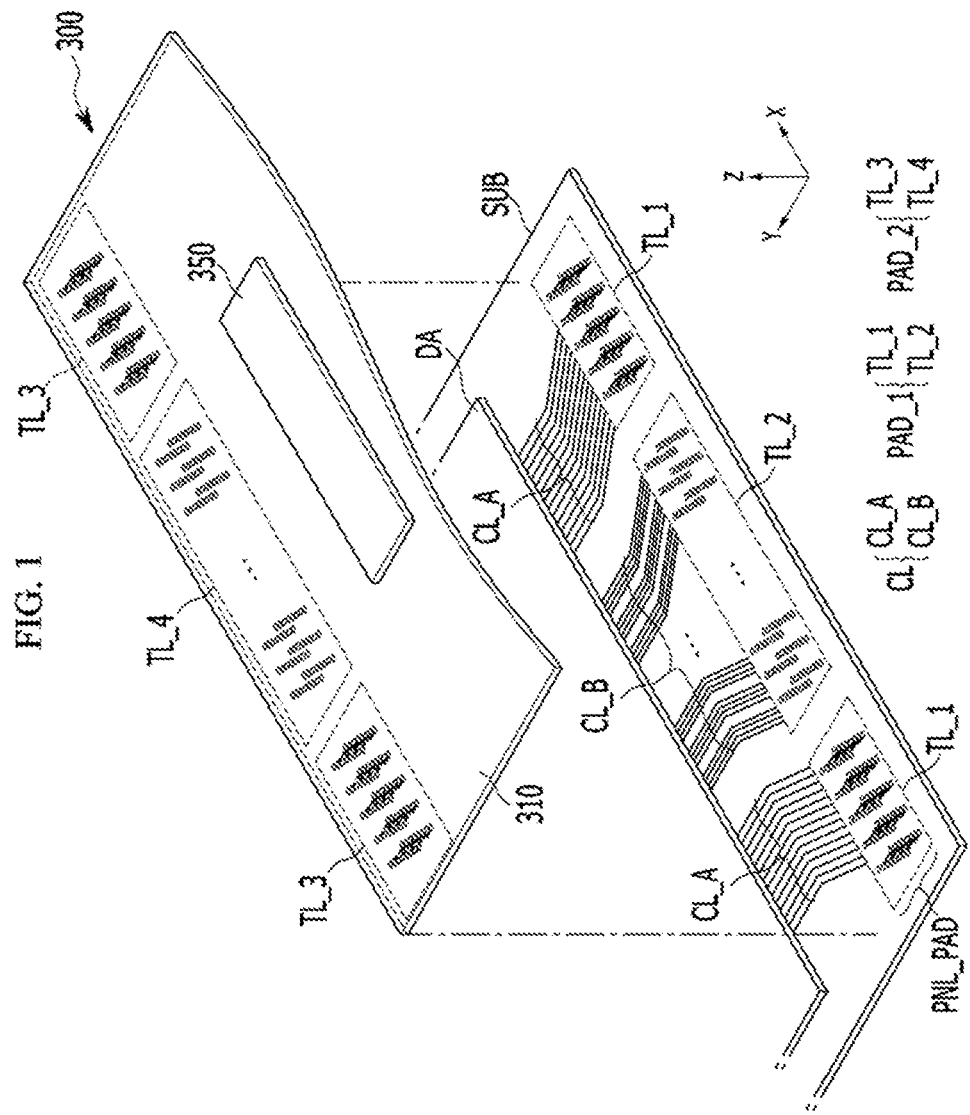
FIG. 1 is a schematic, exploded perspective view of a display device constructed according to the principles of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein. FIG. 1 is a schematic, exploded perspective view of a display device constructed according to the principles of the invention, and FIG. 2 is a schematic, partial side view of the display device of FIG. 1 showing the overlap and connection of a substrate pad and PCB pad.

Figure 2:
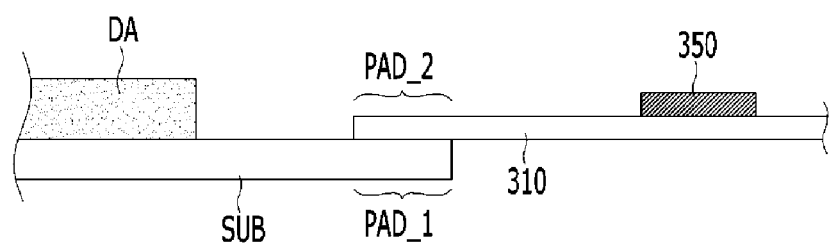
FIG. 2 is a schematic, partial side view of the display device of FIG. 1 showing the overlap and connection of a substrate pad and PCB pad.

Referring to FIGS. 1 and 2, the exemplary display device may include a substrate SUB, a first pad unit PAD_1, and a printed circuit board 300.

In one or more exemplary embodiments, the first pad unit PAD_1 coupled with the printed circuit board 300 may include a first terminal region TL_1, in which a plurality of first pad terminals PAD_TL_A (see FIG. 5) is disposed, and a second terminal region TL_2, in which a plurality of second pad terminals PAD_TL_B (see FIG. 15) is disposed.

In this case, each of the first pad terminals PAD_TL_A (see FIG. 5) includes a plurality of first connection pad terminals ROW_PAD_A, a plurality of second connection pad terminals ROW_PAD_B, and first terminal connection lines TL_CN_A. The first terminal connection lines TL_CN_A electrically connecting the first connection pad terminals ROW_PAD_A and the second connection pad terminals ROW_PAD_B may be disposed on a different layer from that of the first connection pad terminals ROW_PAD_A and the second connection pad terminals ROW_PAD_B.

The display device may include a display area DA and a pad area PNL_PAD. The display area DA and a pad area PNL_PAD represent an area positioned on the substrate SUB.

The display area DA is an area displaying an image, and a display panel 100 (see FIG. 3) emitting light may be positioned in the display area DA. The display panel 100 disposed in the display area DA will be described below.

The pad area PNL_PAD is an area positioned in a peripheral area of the display area DA, and the printed circuit board 300, which transmits a signal from the outside, may be coupled to the pad area PNL_PAD. The first pad unit PAD_1 may be disposed in the pad area PNL_PAD and a second pad unit PAD_2 may be disposed in the printed circuit board SUB, so that the first pad unit PAD_1 and the second pad unit PAD_2 may be electrically coupled to each other.

In this case, the first pad unit PAD_1 may include a first terminal region TL_1 and a second terminal region TL_2. The first terminal region TL_1 and the second terminal region TL_2 represent areas positioned on the substrate SUB.

AS described above, the plurality of first pad terminals PAD_TL_A (see FIG. 5) may be disposed in the first terminal region TL_1 and the plurality of second pad terminals PAD_TL_B (see FIG. 15) may be disposed in the second terminal region TL_2. The plurality of first pad terminals PAD_TL_A (see FIG. 5) and the plurality of second pad terminals PAD_TL_B (see FIG. 15) may have different shapes. A detailed description of the structures of the first terminal region TL_1 and the second terminal region TL_2 will be described below.

The first terminal region TL_1 and the second terminal region TL_2 configuring the pad area PNL_PAD may be arranged in parallel in a first direction. In this case, the pad area PNL_PAD may be disposed while being spaced apart from the display area DA in a second direction. Hereinafter, in the coordinates of the drawing, an X-axis represents the first direction, and the Y-axis represents the second direction.

In one or more exemplary embodiments, as illustrated in FIG. 1, the first terminal regions TL_1 may be disposed at both sides of the second terminal region TL_2, respectively. However, the structural arrangement of the first terminal region TL_1 and the second terminal region TL_2 is not limited thereto. For example, the first terminal region TL_1 may be positioned between the pair of second terminal regions TL_2.

A connection line CL may be positioned between the display area DA and the pad area PNL_PAD, and the display area DA and the pad area PNL_PAD may be connected through the connection line CL. The connection line CL may be connected with a plurality of signal lines disposed in the display area DA. Further, the connection line CL may be connected with the plurality of first pad terminals PAD_TL_A (see FIG. 5) and the plurality of second pad terminals PAD_TL_B (see FIG. 15) of the pad area PNL_PAD.

In this case, the connection line CL may include a first connection line CL_A and a second connection line CL_B. The first connection line CL_A may connect the display area DA and the first terminal region TL_1, and the second connection line CL_B may connect the display area DA and the second terminal region TL_2. Particularly, the first connection line CL_A may be connected with the plurality of first pad terminals PAD_TL_A (see FIG. 5) of the first terminal region TL_1, and the second connection line CL_B may be connected with the plurality of second pad terminals PAD_TL_B (see FIG. 15) of the second terminal region TL_2.

The printed circuit board 300 may be coupled with the first pad unit PAD_1 of the pad area PNL_PAD of the substrate SUB to transmit a signal required for driving the display panel 100 to the display panel 100. In this case, a driving chip 350 may be mounted on a base film 310 of the printed circuit board 300, and the driving chip 350 may be used for driving the display panel 100.

In this case, the second pad unit PAD_2 may be formed at an end portion of one side of the base film 310 in the printed circuit board 300, and the second pad unit PAD_2 may be coupled with the first pad unit PAD_1 of the substrate SUB. The second pad unit PAD_2 may be disposed so as to face the first pad unit PAD_1.

The second pad unit PAD_2 may include a third terminal region TL_3 and a fourth terminal region TL_4. The third terminal region TL_3 and the fourth terminal region TL_4 represent regions positioned in the base film 310.

A plurality of first contact terminals PAD_TL_C (see FIG. 21) may be disposed in the third terminal region TL_3, and a plurality of second contact terminals (not illustrated) may be disposed in the fourth terminal region TL_4.

Figure 5:
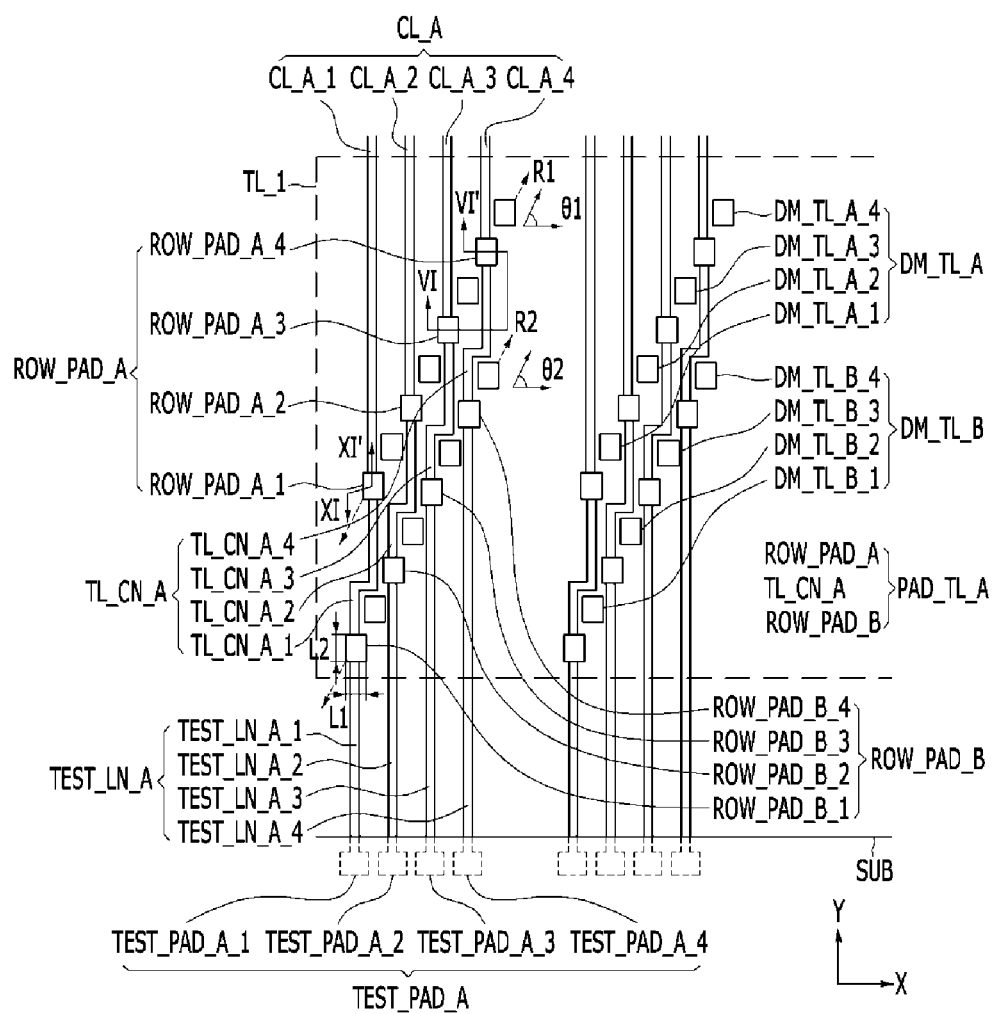
FIG. 5 is an enlarged, plan view of a first terminal region of FIG. 1.

The plurality of first contact terminals PAD_TL_C (see FIG. 21) may have a shape corresponding to that of the plurality of first pad terminals PAD_TL_A (see FIG. 5) so as to be in contact with the plurality of first pad terminals PAD_TL_A (see FIG. 5). Further, the plurality of second contact terminals (not illustrated) may have a shape corresponding to that of the plurality of second pad terminals PAD_TL_B (see FIG. 15) so as to be in contact with the plurality of second pad terminals PAD_TL_B (see FIG. 15).

That is, according to the one or more exemplary embodiments, the second pad unit PAD_2 of the printed circuit board 300 may have a shape corresponding to the first pad unit PAD_1 of the substrate SUB. A plurality of pad terminals disposed in the second pad unit PAD_2 may be disposed in a pattern, which is the same as or similar to that of the plurality of pad terminals of the first pad unit PAD_1. A detailed description of the structures of the third terminal region TL_3 and the fourth terminal region TL_4 will be described below.

Hereinafter, the display panel 100 formed in the display area DA will be described in detail with reference to FIGS. 3 and 4.

Figure 3:
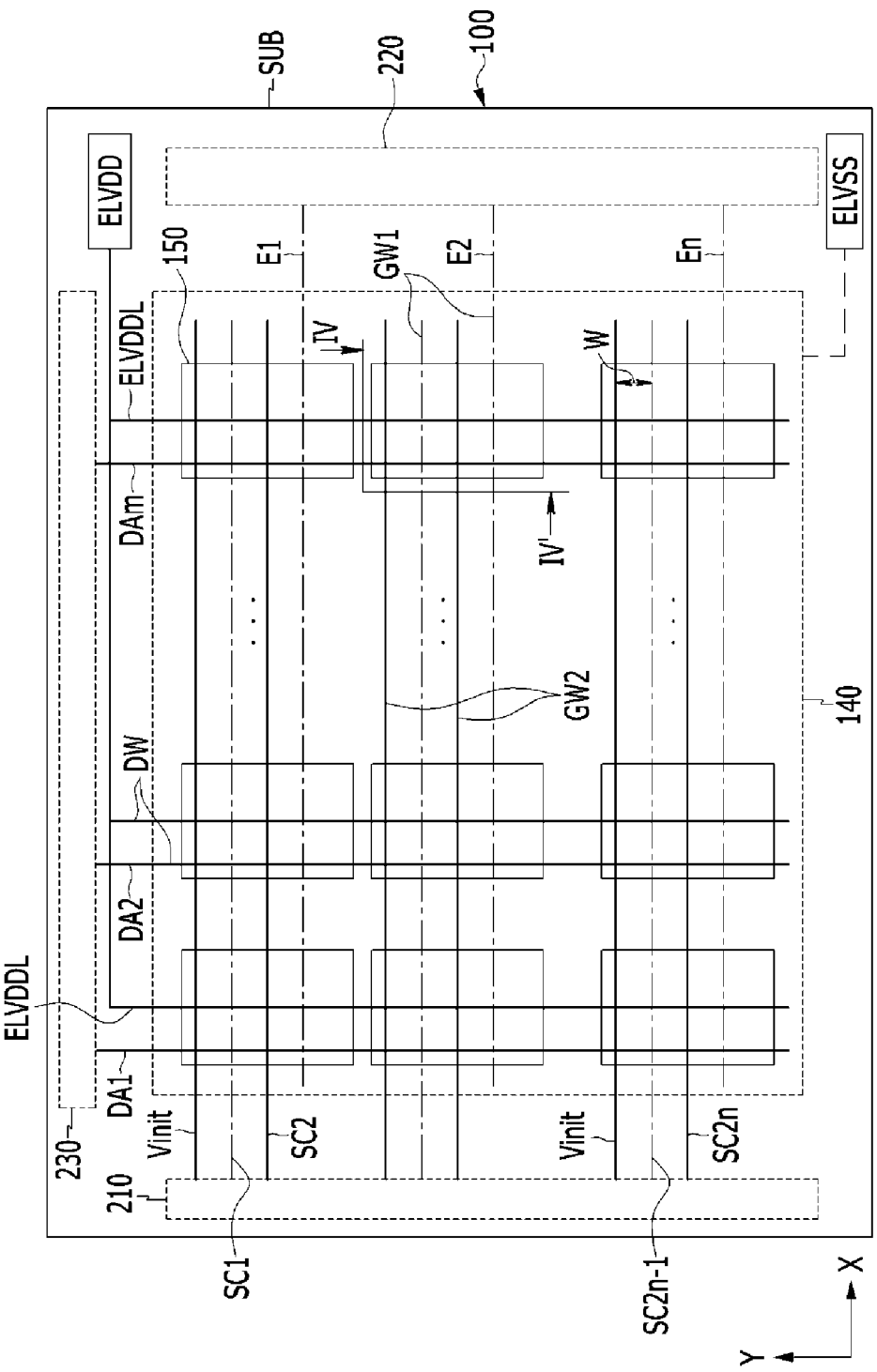
FIG. 3 is a diagram schematically illustrating a display area of the device shown in FIG. 1.
Figure 4:
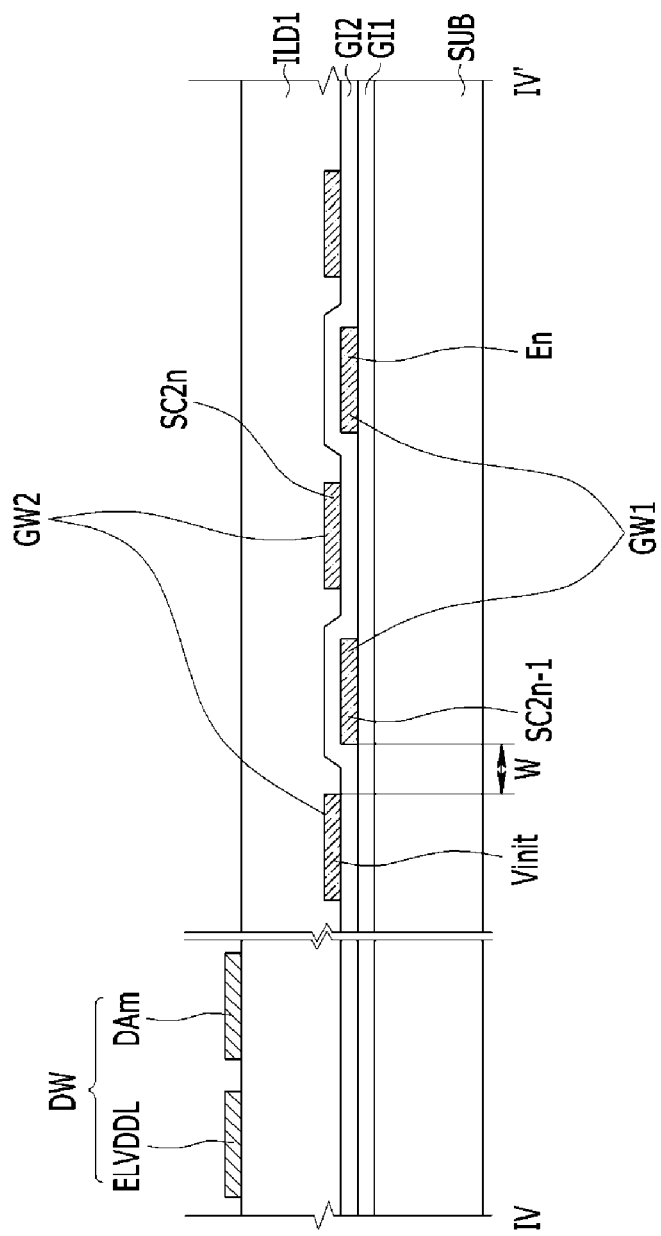
FIG. 4 is a cross-sectional view taken along line IV-IV' of FIG. 3.

FIG. 3 is a diagram schematically illustrating the display area of the device shown in FIG. 1, and FIG. 4 is a cross-sectional view taken along line IV-IV' of FIG. 3.

According to the one or more exemplary embodiments, the display panel 100 includes first gate lines GW1, second gate lines GW2, data lines DW, a display unit 140, and pixels 150. In FIGS. 3 and 4, it is described that the gate lines include the first gate lines GW1 and the second gate lines GW2 positioned on different layers, but the gate lines are not limited thereto, and may also be disposed on one layer.

A gate driver 210 sequentially supplies a scan signal to first scan lines SC2 to SC2n or second scan lines SC1 to SC2n-1 included in the first gate lines GW1 or the second gate lines GW2 in response to a control signal supplied from an external control circuit (not illustrated), for example, a timing controller. Here, n is an integer equal to or larger than 1, and the same is applied to the description below.

Then, the pixel 150 is selected by the scan signal and sequentially receives a data signal. Herein, the gate driver 210 illustrated in FIG. 3 may be disposed within the driving chip 350 (see FIG. 1) on the printed circuit board 300 (see FIG. 1), so that the gate driver 210 illustrated in FIG. 3 is located in the display panel 100 for convenience of the description.

The first gate lines GW1 are positioned on the substrate SUB with a first insulating layer GI1 interposed therebetween, and are extended in the first direction. The first gate lines GW1 include a second scan line SC2n-1 and an emission control line E1 to En.

The second scan line SC2n-1 is connected to the gate driver 210, and receives the scan signal from the gate driver 210. An emission control line EN is connected with the emission control driver 220, and receives an emission control signal from the emission control driver 220. Herein, the emission control driver 220 illustrated in FIG. 3 may be formed within the driving chip 350 (see FIG. 1) on the printed circuit board 300 (see FIG. 1), similar to the gate driver 210, so that the emission control driver 220 illustrated in FIG. 3 is located in the display panel 100 for convenience of the description.

The second gate lines GW2 are positioned on the first gate lines GW1 with a second insulating layer GI2 interposed therebetween, and are extended in the first direction. The second gate lines GW2 include the first scan line SC2n and an initialization power source line Vinit.

The first gate lines GW1 and the second gate lines GW2 do not overlap one another.

The first scan line SC2n is connected to the gate driver 210, and receives the scan signal from the gate driver 210. The initialization power source line Vinit is connected to the gate driver 210, and receives an initialization power source from the gate driver 210.

In the one or more exemplary embodiments, the initialization power source line Vinit receives the initialization power source from the gate driver 210, but the initialization power source line Vinit may be connected with another additional configuration and receive the initialization power source from the additional configuration.

The emission control driver 220 sequentially supplies the emission control signal to the emission control line EN in response to a control signal supplied from the outside, such as the timing controller. Then, the emission of the pixel 150 is controlled by the emission control signal.

That is, the emission control signal controls an emission time of the pixel 150. However, the emission control driver 220 may be omitted according to an internal structure of the pixel 150.

The data driver 230 supplies a data signal to the data line DAm of the data lines DW in response to a control signal supplied from the outside, such as the timing controller. The data signal provided to the data line DAm is provided to the pixel 150 selected by the scan signal whenever the scan signal is provided to the first scan lines SC2n or the second scan line SC2n-1. Then, the pixel 150 charges a voltage corresponding to the data signal, and emits light with luminance corresponding to the charge. Herein, the data driver 230 illustrated in FIG. 3 may be formed within the driving chip 350 (see FIG. 1) on the printed circuit board 300 (see FIG. 1) to be described below, similar to the gate driver 210, so that the data driver 230 illustrated in FIG. 3 is located in the display panel 100 for convenience of the description.

The data lines DW are positioned on the second gate lines GW2 with a third insulating layer ILD1 interposed therebetween, and are extended in the second direction crossing the first direction. The data lines DW include data lines DA1 to DAm and a driving power source line ELVDDL. The data line DAm is connected to the data driver 230, and receives the data signal from the data driver 230. The driving power source line ELVDDL is connected to an external first power source ELVDD which will be described below, and receives a driving power source from the first power source ELVDD.

In this case, the driving power source line ELVDDL and the data line DAm may be formed on the same layer on the third insulating layer ILD1. However, the inventive concepts are not limited thereto, and driving power source line ELVDDL and the data line DAm may be formed on different layers.

For example, the driving power source line ELVDDL may be formed on the same layer as that of the first gate lines GW1, and the data line DAm may be formed on the same layer as that of the second gate lines GW2. In contrast to this, the driving power source line ELVDDL may be formed on the same layer as that of the second gate lines GW2, and the data line DAm may be formed on the same layer as that of the first gate lines GW1.

The display unit 140 includes the plurality of pixels 150 positioned in crossing regions of the first gate lines GW1, the second gate lines GW2, and the data lines DW. Here, each pixel 150 includes an organic light emitting diode, which emits light with luminance corresponding to a driving current corresponding to the data signal, and a pixel circuit for controlling a driving current flowing in the organic light emitting diode.

The pixel circuit is connected with each of the first gate lines GW1, the second gate lines GW2, and the data lines DW, and the organic light emitting diode is connected with the pixel circuit. The pixel 150 is described as the organic light emitting diode, but the pixel 150 of the exemplary display devices are not limited thereto, and may be take other forms, such as a liquid crystal display device, an electrophoretic display device, and the like.

The organic light emitting diode of the display unit 140 is connected with the external first power source ELVDD with the pixel circuit interposed therebetween, and is connected with the second power source ELVSS. Each of the first power source ELVDD and the second power source ELVSS supplies a driving power source and a common power source to the pixel 150 of the display unit 140, respectively, and the pixel 150 emits light with luminance corresponding to a driving current flowing from the first power source ELVDD to the organic light emitting diode in response to a data signal according to the driving power source and the common power source supplied to the pixel 150.

As described above, in the exemplary display devices constructed according to the principles of the invention, each of the first gate lines GW1 and the second gate lines GW2, which are the gate lines crossing the pixel 150 in the first direction and not overlapping one another, is not positioned on the same layer, but each of the first gate lines GW1 and the second gate lines GW2 is positioned on different layers with the second insulating layer GI2 interposed therebetween, so that it is possible to decrease a distance W between the gate lines, which are positioned in the different layers and adjacent to each other, thereby forming more pixels 150 in the same area. That is, it is possible to form the display device having higher resolution.

Hereinafter, a structure of the first pad terminal PAD_TL_A disposed in the first terminal region TL_1 will be described in detail with reference to FIGS. 5 to 14.

Figure 6:
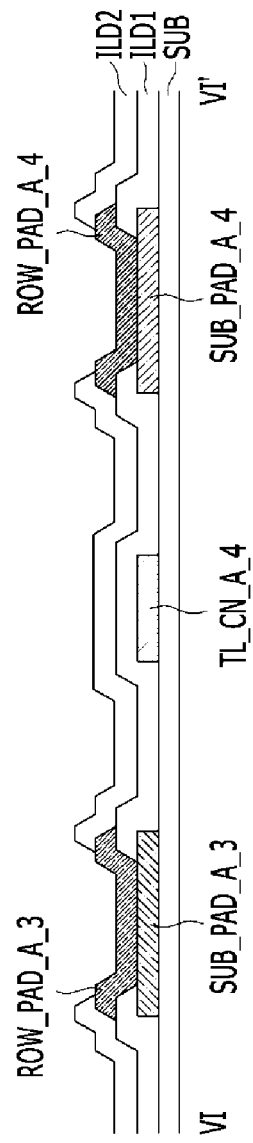
FIG. 6 is a cross-sectional view taken along line VI-VI' of FIG. 5.
Figure 8:
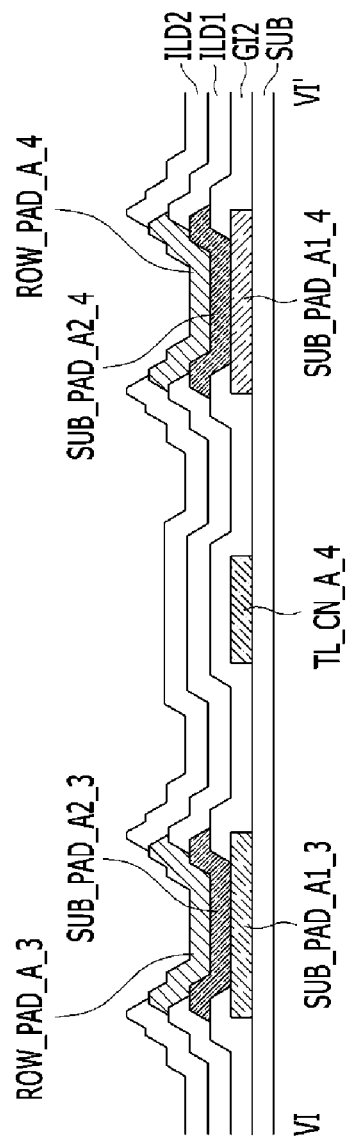
FIG. 8 is a cross-sectional view illustrating a first modified example of the first terminal connection line of FIG. 6.
Figure 9:
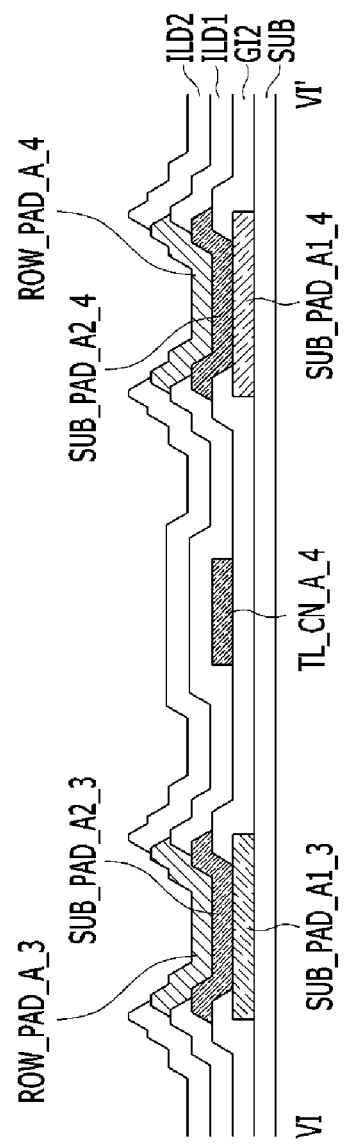
FIG. 9 is a cross-sectional view illustrating a second modified example of the first terminal connection line of FIG. 6.
Figure 11:
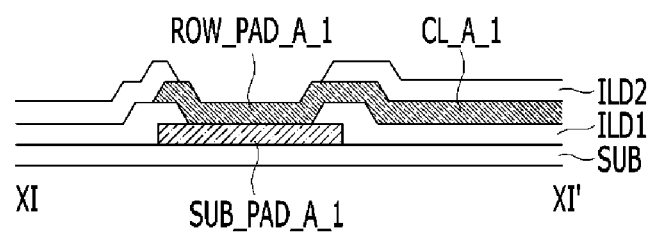
FIG. 11 is a cross-sectional view taken along line XI-XI' of FIG. 5.
Figure 12:
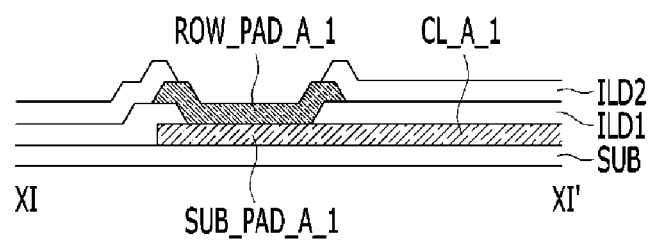
FIG. 12 is a cross sectional view illustrating a first modified example of a first connection line of FIG. 11.
Figure 13:
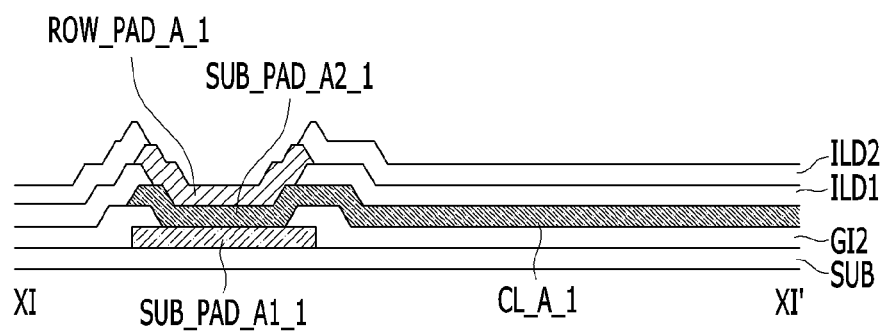
FIG. 13 is a cross sectional view illustrating a second modified example of the first connection line of FIG. 11.
Figure 14:
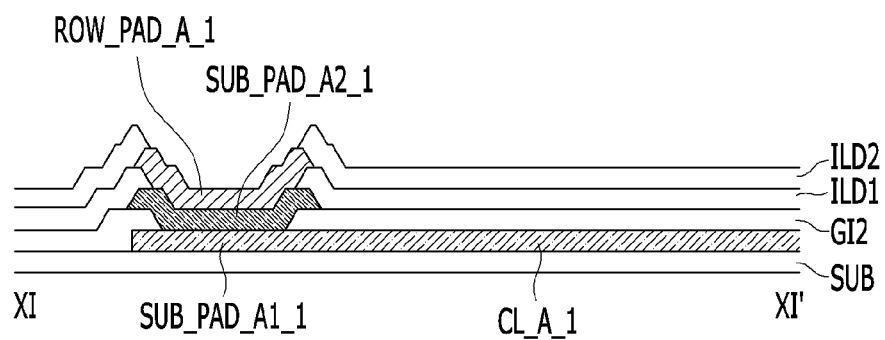
FIG. 14 is a cross sectional view illustrating a third modified example of the first connection line of FIG. 11.

FIG. 5 is an enlarged, plan view of the first terminal region of FIG. 1, and FIG. 6 is a cross-sectional view taken along line VI-VI' of FIG. 5. FIG. 8 is a cross-sectional view illustrating a first modified example of the first terminal connection line of FIG. 6, and FIG. 9 is a cross-sectional view illustrating a second modified example of the first terminal connection line of FIG. 6. FIG. 11 is a view taken along line XI-XI' of FIG. 5, and FIG. 12 is a cross sectional view illustrating a first modified example of the first connection line of FIG. 11. FIG. 13 is a cross sectional view illustrating a second modified example of the first connection line of FIG. 11, and FIG. 14 is a cross sectional view illustrating a third modified example of the first connection line of FIG. 11.

Referring to FIGS. 5 and 6, the plurality of first pad terminals PAD_TL_A may be disposed in the first terminal region TL_1 in the first direction. In this case, the first terminal region TL_1 may be connected to the power source lines, for example, the driving power source line ELVDDL, the common power source line, the initialization power source line, and the scan line, of the display area DA (see FIG. 1) through the first connection line CL_A. The plurality of first pad terminals PAD_TL_A may be disposed within the first terminal region TL_1 while being spaced from one another with a predetermined interval in the first direction.

In one or more exemplary embodiments, each of the plurality of first pad terminals PAD_TL_A may include a plurality of first connection pad terminals ROW_PAD_A, a plurality of second connection pad terminals ROW_PAD_B, a plurality of first dummy pad terminals DM_TL_A, a plurality of second dummy pad terminals DM_TL_B, and a plurality of first terminal connection lines TL_CN_A.

The first connection pad terminals ROW_PAD_A may be disposed while being spaced apart from one another in a predetermined direction. In this case, the first connection pad terminals ROW_PAD_A may be arranged in a first row R1 which has a first inclination angle θ1 with the first direction. The first inclination angle θ1 may be larger than 0° and smaller than 90°.

All of the first connection pad terminals ROW_PAD_A disposed in the first terminal region TL_1 may be disposed while being inclined in the same direction. That is, the first connection pad terminals ROW_PAD_A may be disposed while being inclined at the same angle based on the first direction within the first terminal region TL_1. For example, as illustrated in FIG. 5, the first connection pad terminals ROW_PAD_A may be arranged while being inclined in a direction of approximately one o'clock based on the second direction.

In one or more exemplary embodiments, the first terminal region TL_1 may be disposed at each of a left side and a right side of the second terminal region TL_2, and all of the first connection pad terminals ROW_PAD_A of the first terminal region TL_1 disposed at the left side and the right side may be arranged while being inclined at the same angle.

Intervals between the adjacent first connection pad terminals ROW_PAD_A may be the same as one another. For example, an interval between a first one of the first connection pad terminals ROW_PAD_A_1 and a second one of the first connection pad terminals ROW_PAD_A_2, an interval between the second one of the first connection pad terminals ROW_PAD_A_2 and a third one of the first connection pad terminals ROW_PAD_A_3, and an interval between the third one of the first connection pad terminals ROW_PAD_A_3 and a fourth one of the first connection pad terminals ROW_PAD_A_4 may be the same. Herein, the interval between the first connection pad terminals ROW_PAD_A represents a spaced distance in the first row R1.

In this case, the first connection pad terminals ROW_PAD_A are regions electrically contacting the first contact pad terminals ROW_PAD_E (referring to FIG. 21) of the printed circuit board 300, and may approximately have a quadrangular shape.

The second connection pad terminals ROW_PAD_B may be disposed while being spaced apart from the first connection pad terminals ROW_PAD_A in the second direction. Similar to the first connection pad terminals ROW_PAD_A, the second connection pad terminals ROW_PAD_B may be disposed while being spaced apart from one another in a predetermined direction.

In this case, the second connection pad terminals ROW_PAD_B may be arranged in a second row R2 which has a second inclination angle θ2 with the first direction. The second inclination angle θ2 may be larger than 0° and smaller than 90°.

All of the second connection pad terminals ROW_PAD_B disposed in the first terminal region TL_1 may be disposed while being inclined in the same direction, similar to the first connection pad terminals ROW_PAD_A. That is, the second connection pad terminals ROW_PAD_B may be disposed while being inclined at the same angle based on the first direction within the first terminal region TL_1. For example, as illustrated in FIG. 5, the second connection pad terminals ROW_PAD_B may be arranged while being inclined in the direction of approximately one o'clock based on the second direction.

Similar to the first connection pad terminals ROW_PAD_A, all of the second connection pad terminals ROW_PAD_B of the first terminal region TL_1 disposed at the left side and the right side of the second terminal region TL2 may be disposed while being inclined at the same angle In the illustrated exemplary embodiments, the first inclination angle θ1 may be the same as the second inclination angle θ2. Accordingly, all of the first connection pad terminals ROW_PAD_A and the second connection pad terminals ROW_PAD_B may be arranged while being inclined at the same angle with respect to the first direction. However, the inventive concepts are not limited thereto, and the first inclination angle θ1 may be different from the second inclination angle θ2. That is, the first connection pad terminals ROW_PAD_A and the second connection pad terminals ROW_PAD_B may be arranged while being inclined at different angles with respect to the first direction.

Figure 19:
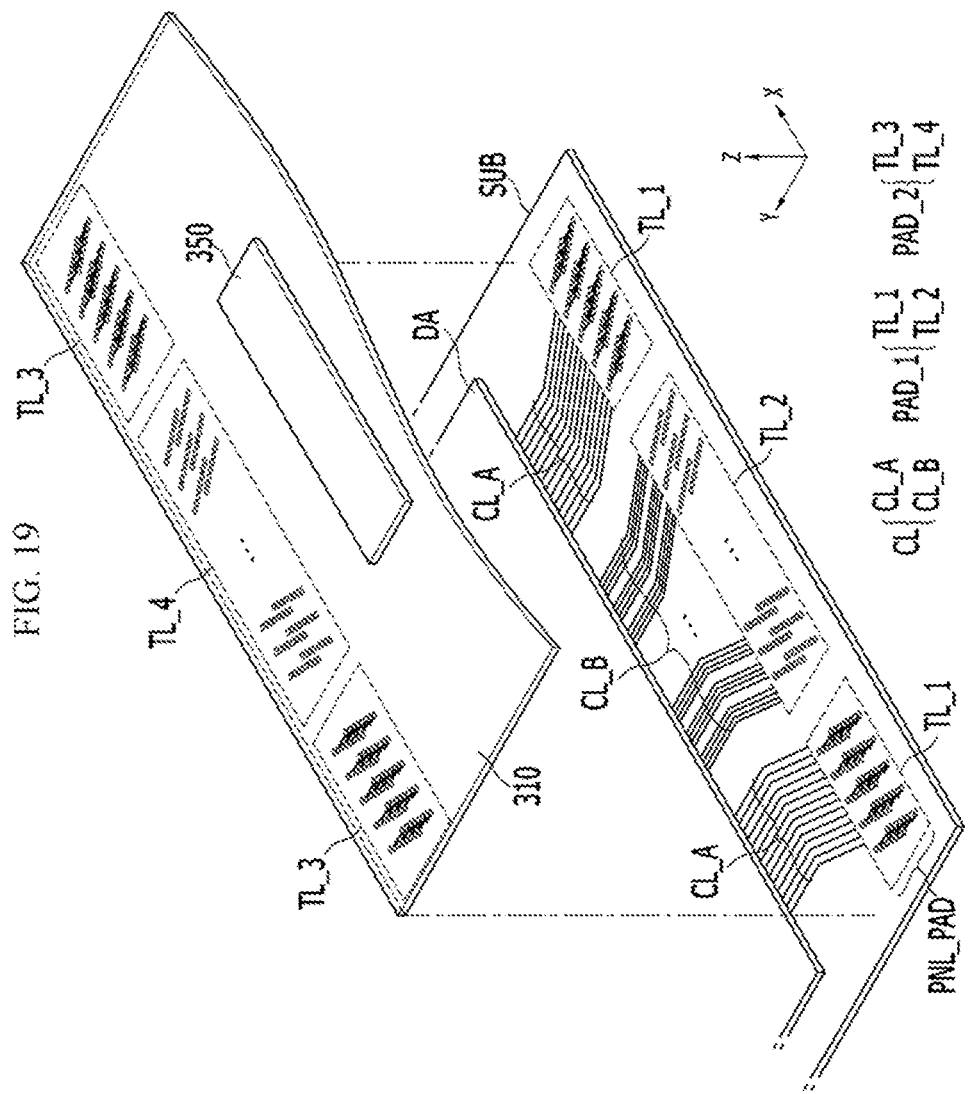
FIG. 19 is a diagram illustrating a modified example of first and second terminal regions of FIG. 1.

As illustrated in FIG. 19, the plurality of first pad terminals PAD_TL_A disposed in both first terminal regions TL_1 may be disposed so as to be symmetric to one another based on the second terminal region TL_2. For example, the plurality of first pad terminals PAD_TL_A disposed in the left first terminal region TL_1 based on the second terminal region TL_2 may be disposed while being inclined in the direction of approximately one o'clock based on the second direction, and the plurality of first pad terminals PAD_TL_A disposed in the right first terminal region TL_1 based on the second terminal region TL_2 may be disposed while being inclined in the direction of approximately eleven o'clock based on the second direction.

Intervals between the adjacent second connection pad terminals ROW_PAD_B may be the same as one another. For example, an interval between a first one of the second connection pad terminals ROW_PAD_B_1 and a second one of the second connection pad terminals ROW_PAD_B_2, an interval between the second one of the second connection pad terminals ROW_PAD_B_2 and a third one of the second connection pad terminals ROW_PAD_B_3, and an interval between the third one of the second connection pad terminal ROW_PAD_B_3 and a fourth one of the second connection pad terminals ROW_PAD_B_4 may be the same. Herein, the interval between the second connection pad terminals ROW_PAD_B represents a spaced distance in the second row R2.

The second connection pad terminals ROW_PAD_B are regions electrically contacting second contact pad terminals ROW_PAD_F of the printed circuit board 300, and may approximately have a quadrangular shape.

In one or more exemplary embodiments, the quadrangular shape of each of the first connection pad terminals ROW_PAD_A and the second connection pad terminals ROW_PAD_B may include a first side L1 parallel in the first direction and a second side L2 parallel in the second direction. Herein, the first side L1 and the second side L2 may be adjacent to each other.

In this case, in the quadrangle, the second side L2 may be formed to be longer than the first side L1. (L1<L2). That is, the quadrangle may be a rectangular shape elongated in the second direction.

When each of the first connection pad terminals ROW_PAD_A and the second connection pad terminals ROW_PAD_B is formed in a rectangular shape elongated in the second direction, an interval between the first connection pad terminals ROW_PAD_A and the second connection pad terminals ROW_PAD_B in the first direction may be decreased.

Accordingly, the number of first connection pad terminals ROW_PAD_A disposed within the first terminal region TL_1 and the number of second connection pad terminals ROW_PAD_B disposed within the first terminal region TL_1 may be increased.

The plurality of first connection pad terminals ROW_PAD_A and the plurality of second connection pad terminals ROW_PAD_B may be connected by the first terminal connection lines TL_CN_A. More particularly, the first terminal connection line TL_CN_A may connect one of the first connection pad terminals ROW_PAD_A and one of second connection pad terminals ROW_PAD_B to each other.

For example, the first one of the first connection pad terminals ROW_PAD_A_1 and the first one of the second connection pad terminals ROW_PAD_B_1 may be connected to each other by a first one of the first terminal connection lines TL_CN_A_1, and the second one of the first connection pad terminals ROW_PAD_A_2 and the second one of the second connection pad terminals ROW_PAD_B_2 may be connected to each other by a second one of the first terminal connection lines TL_CNA_2. Further, the third one of the first connection pad terminals ROW_PAD_A_3 and the third one of the second connection pad terminals ROW_PAD_B_3 may be connected to each other by a third one of the first terminal connection lines TL_CN_A_3, and the fourth one of the first connection pad terminals ROW_PAD_A_4 and the fourth one of the second connection pad terminals ROW_PAD_B_4 may be connected to each other by a fourth one of the first terminal connection lines TL_CN_A_4.

According to one or more exemplary embodiments, at least one first terminal connection line TL_CN_A may have at least one bent portion defining a bent shape. For example, as illustrated in FIG. 5, the first one of the first terminal connection lines TL_CN_A_1 is extended from the first one of the second connection pad terminals ROW_PAD_B_1 to the first one of the first connection pad terminals ROW_PAD_A_1 in an up direction in the second direction. In this case, the first one of the first terminal connection lines TL_CN_A_1 may be disposed in a form which is bent in a right of the first direction, and then is bent in the up direction of the second direction again. That is, the first one of the first terminal connection lines TL_CN_A_1 may be disposed in a shape bent two times.

The first connection pad terminals ROW_PAD_A may be connected with the first connection lines CL_A. For example, the first one of the first connection pad terminals ROW_PAD_A_1 may be connected with the first one of the first connection lines CL_A_1, and the second one of the first connection pad terminals ROW_PAD_A_2 may be connected with the second one of the first connection lines CL_A_2. The third one of the first connection pad terminals ROW_PAD_A_3 may be connected with the third one of the first connection lines CL_A_3, and the fourth one of the first connection pad terminals ROW_PAD_A_4 may be connected with the fourth one of the first connection lines CL_A_4.

In one or more exemplary embodiments, at least one first dummy pad terminal DM_TL_A may be disposed between pairs of adjacent first connection pad terminals ROW_PAD_A of the first connection pad terminals ROW_PAD_A.

For example, a first one of the first dummy pad terminals DM_TL_A_1 may be disposed between the first one of the first connection pad terminals ROW_PAD_A_1 and the second one of the first connection pad terminals ROW_PAD_A_2, and a second one of the first dummy pad terminals DM_TL_A_2 may be disposed between the second one of the first connection pad terminals ROW_PAD_A_2 and the third one of the first connection pad terminals ROW_PAD_A_3. A third one of the first dummy pad terminals DM_TL_A_3 may be disposed between the third one of the first connection pad terminals ROW_PAD_A_3 and the fourth one of the first connection pad terminals ROW_PAD_A_4, and a fourth one of the first dummy pad terminals DM_TL_A_4 may be disposed while being adjacent to the fourth one of the first connection pad terminals ROW_PAD_A_4.

In FIG. 5, it is illustrated that one first dummy pad terminal DM_TL_A is disposed between the pair of adjacent first connection pad terminals ROW_PAD_A. However, the inventive concepts are not limited thereto, and other configurations, such as two or more first dummy pad terminals DM_TL_A may be provided.

In this case, the plurality of first connection pad terminals ROW_PAD_A and the first dummy pad terminal DM_TL_A may be arranged to be parallel to each other. That is, the first connection pad terminals ROW_PAD_A and the first dummy pad terminal DM_TL_A may be serially arranged along the first row R1, and may be disposed while being inclined in the first inclination angle θ1 with respect to the first direction.

In one or more exemplary embodiments, the first dummy pad terminals DM_TL_A are not electrically connected with the plurality of adjacent first connection pad terminals ROW_PAD_A or the plurality of first terminal connection lines TN_CN_A_3.

At least one first dummy pad terminal DM_TL_A is disposed between the pair of adjacent first connection pad terminals ROW_PAD_A, so that an interval between the adjacent first connection pad terminals ROW_PAD_A is increased, thereby preventing capacitive coupling generated between the first connection pad terminals ROW_PAD_A.

Further, at least one second dummy pad terminal DM_TL_B may be disposed between pairs of adjacent second connection pad terminals ROW_PAD_B of the second connection pad terminals ROW_PAD_B.

For example, a first one of the second dummy pad terminals DM_TL_B_1 may be disposed between the first one of the second connection pad terminals ROW_PAD_B_1 and the second one of the second connection pad terminals ROW_PAD_B_2, and a second one of the second dummy pad terminals DM_TL_B_2 may be disposed between the second one of the second connection pad terminals ROW_PAD_B_2 and the third one of the second connection pad terminals ROW_PAD_B_3. A third one of the second dummy pad terminals DM_TL_B_3 may be disposed between the third one of the second connection pad terminals ROW_PAD_B_3 and the fourth one of the second connection pad terminals ROW_PAD_B_4, and a fourth one of the second dummy pad terminals DM_TL_B_4 may be disposed while being adjacent to the fourth one of the second connection pad terminals ROW_PAD_B_4.

It is illustrated that one second dummy pad terminal DM_TL_B is disposed between the pair of adjacent second connection pad terminals ROW_PAD_B. However, the inventive concepts are not limited thereto, and two or more second dummy pad terminals DM_TL_B may be so disposed.

The second connection pad terminals ROW_PAD_B and the second dummy pad terminals DM_TL_B may be arranged to be parallel to one another. That is, the second connection pad terminals ROW_PAD_B and the second dummy pad terminal DM_TL_B may be serially arranged along the second row R2, and may be disposed while being inclined in the second inclination angle θ2 with respect to the first direction.

In one or more exemplary embodiments, the first terminal connection line TL_CN_A may be disposed on a different layer from that of the first connection pad terminals ROW_PAD_A and the second connection pad terminal ROW_PAD_B. The first terminal connection lines TL_CN_A are electrically connected with the first connection pad terminals ROW_PAD_A and the second connection pad terminals ROW_PAD_B, but the first terminal connection lines TL_CN_A may be positioned on a different layer from that of the first connection pad terminals ROW_PAD_A and the second connection pad terminals ROW_PAD_B on the substrate SUB.

Hereinafter, a laminated structure of the first terminal connection lines TL_CN_A and the first connection pad terminals ROW_PAD_A will be described in detail with reference to FIG. 6. However, FIG. 6 does not illustrate a laminated structure of the first terminal connection lines TL_CN_A and the second connection pad terminals ROW_PAD_B, but the laminated structure of the first terminal connection lines TL_CN_A and the second connection pad terminals ROW_PAD_B may be the same as the laminated structure of the first terminal connection lines TL_CN_A and the first connection pad terminals ROW_PAD_A.

Referring to FIG. 6, for instance, the third one of the first connection pad terminals ROW_PAD_A_3 and the adjacent fourth one of the first connection pad terminals ROW_PAD_A_4 may be disposed on the same layer. The fourth one of the first terminal connection lines TL_CN_A_4 may be disposed on a different layer from that of the third one of the first connection pad terminals ROW_PAD_A_3 and the fourth one of the first connection pad terminals ROW_PAD_A_4.

Particularly, the first terminal connection line TL_CN_A may be positioned in a lower portion of the third one of the first connection pad terminals ROW_PAD_A_3 and the fourth one of the first connection pad terminals ROW_PAD_A_4 in a cross-section, and the third insulating layer ILD1 may be disposed between the fourth one of the first terminal connection lines TL_CN_A_4 and the third one of the first connection pad terminals ROW_PAD_A_3 and the fourth one of the first connection pad terminals ROW_PAD_A_4. That is, based on the third insulating layer ILD1, the fourth one of the first terminal connection lines TL_CN_A_4 may be disposed under the third insulating layer ILD1, and the third one of the first connection pad terminals ROW_PAD_A_3 and the fourth one of the first connection pad terminals ROW_PAD_A_4 may be disposed on a cross-section of the third insulating layer ILD1. A through-hole, through which a third one of the first lower pad lines SUB_PAD_A_3 and a fourth one of the first lower pad lines SUB_PAD_A_4 positioned under the third insulating layer ILD1 are partially exposed, may be formed in the third insulating layer ILD1. Through the through hole, the third one of the first connection pad terminals ROW_PAD_A_3 may be in contact with the third one of the first lower pad lines SUB_PAD_A_3 and the fourth one of the first connection pad terminals ROW_PAD_A_4 may be in contact with fourth one of the first lower pad lines SUB_PAD_A_4. In this case, the third one of the first lower pad lines SUB_PAD_A_3 and the fourth one of the first lower pad lines SUB_PAD_A_4 may be positioned on the same layer as that of the fourth one of the first terminal connection lines TL_CN_A_4.

A fourth insulating layer ILD2, which covers the third one of the first connection pad terminals ROW_PAD_A_3 and the fourth one of the first connection pad terminals ROW_PAD_A_4, may be positioned on a cross-section of the third insulating layer ILD1. A through-hole, through which the third one of the first connection pad terminals ROW_PAD_A_3 and the fourth one of the first connection pad terminals ROW_PAD_A_4 are partially exposed, may be formed in the fourth insulating layer ILD2. In this case, the exposed third one of the first connection pad terminals ROW_PAD_A_3 and fourth one of the first connection pad terminals ROW_PAD_A_4 may be electrically connected with the first contact pad terminal ROW_PAD_E of the printed circuit board 300 through a conductive ball CNB (see FIG. 24).

As described above, each of the third one of the first connection pad terminals ROW_PAD_A_3 and the fourth one of the first connection pad terminals ROW_PAD_A_4 may be electrically connected with the different first contact pad terminals ROW_PAD_E of the printed circuit board 300. When the substrate SUB and the printed circuit board 300 are coupled to each other, the third one of the first connection pad terminals ROW_PAD_A_3 and the fourth one of the first connection pad terminals ROW_PAD_A_4 may be electrically separated from each other. That is, the fourth one of the first terminal connection lines TL_CN_A_4 is disposed in the different layer from that of the third one of the first connection pad terminals ROW_PAD_A_3 and the fourth one of the first connection pad terminals ROW_PAD_A_4, so that it is possible to prevent the third one of the first connection pad terminals ROW_PAD_A_3 and the fourth one of the first connection pad terminals ROW_PAD_A_4 from being short-circuited from each other.

Figure 7:
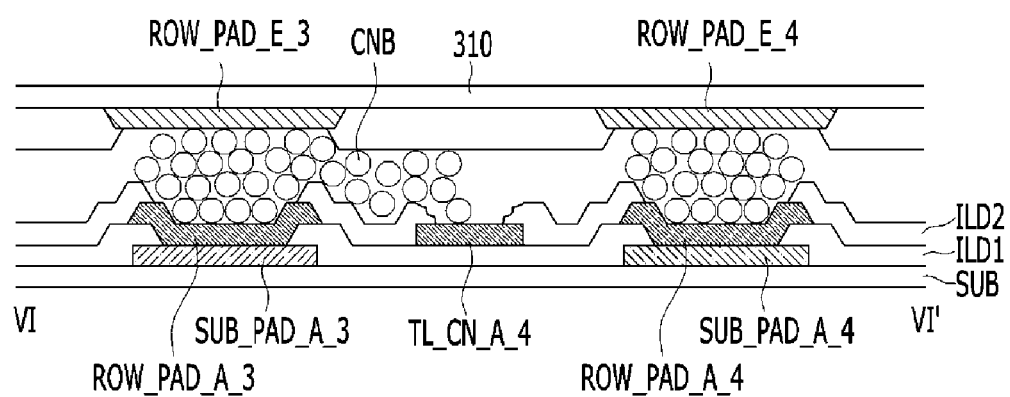
FIG. 7 is a cross-sectional view of a comparative example, in which first and second connection pad terminals and a first terminal connection line are disposed on the same layer.

FIG. 7 is a cross-sectional view of a comparative example, in which the first and second connection pad terminals and the first terminal connection line are disposed on the same layer, and when the fourth one of the first terminal connection lines TL_CN_A_4 is disposed on the same layer as that of the third one of the first connection pad terminals ROW_PAD_A_3 and the fourth one of the first connection pad terminals ROW_PAD_A_4, the third one of the first connection pad terminals ROW_PAD_A_3 and the fourth one of the first connection pad terminals ROW_PAD_A_4 may be short-circuited from each other.

Referring to FIG. 7, when the fourth one of the first terminal connection lines TL_CN_A_4 is disposed on the same layer as that of the third one of the first connection pad terminals ROW_PAD_A_3 and the fourth one of the first connection pad terminals ROW_PAD_A_4, the fourth insulating layer ILD2 may be disposed on the fourth one of the first terminal connection lines TL_CN_A_4. During a manufacturing process of the display device, a crack may be generated in the fourth insulating layer ILD2 covering the fourth one of the first terminal connection lines TL_CN_A_4 and a part of the fourth insulating layer ILD2 may be separated. In this case, a part of the fourth one of the first terminal connection lines TL_CN_A_4 disposed under the fourth insulating layer ILD2 may be exposed.

A part of the conductive ball CNB, which electrically connects the third one of the first connection pad terminals ROW_PAD_A_3 and the third one of the first contact pad terminals ROW_PAD_E_3 may be in contact with the fourth one of the exposed first terminal connection lines TL_CN_A_4. Accordingly, the fourth one of the first terminal connection lines TL_CN_A_4 is electrically connected to the third one of the first connection pad terminals ROW_PAD_A_3, and finally, the third one of the first connection pad terminals ROW_PAD_A_3 and the fourth one of the first connection pad terminals ROW_PAD_A_4 may be short-circuited from each other.

As described above, as illustrated in FIG. 7, when the fourth one of the first terminal connection lines TL_CN_A_4 is disposed on the same layer as that of the third one of the first connection pad terminals ROW_PAD_A_3 and the fourth one of the first connection pad terminals ROW_PAD_A_4, there is a concern that the third one of the first connection pad terminals ROW_PAD_A_3 and the fourth one of the first connection pad terminals ROW_PAD_A_4 may be short-circuited from each other, but like the exemplary embodiment illustrated in FIG. 6, when the fourth one of the first terminal connection lines TL_CN_A_4 is disposed on the different layer from that of the third one of the first connection pad terminals ROW_PAD_A_3 and the fourth one of the first connection pad terminals ROW_PAD_A_4, it is possible to prevent the third one of the first connection pad terminals ROW_PAD_A_3 and the fourth one of the first connection pad terminals ROW_PAD_A_4 from being short-circuited from each other. In the exemplary embodiments, the first terminal connection line TL_CN_A may be disposed on the same layer as that of the gate line disposed in the display area DA. For example, when the gate line of the display area DA is disposed in a single layer, the first terminal connection line TL_CN_A may be disposed on the same layer as that of the gate line of the single layer.

However, the inventive concepts are not limited thereto, and when the gate lines disposed in the display area DA are formed of the gate lines in dual layers, the first terminal connection lines TL_CN_A may be disposed on the same layer as that of any one of the gate lines of the dual layers. For example, as illustrated in FIGS. 8 and 9, the fourth one of the first terminal connection lines TL_CN_A_4 may be disposed on the same layer as that of any one of the first gate lines GW1 (see FIG. 4) and the second gate lines GW2 (see FIG. 4).

Referring to FIG. 8, the fourth one of the first terminal connection lines TL_CN_A_4 may be disposed on the same layer as that of the first gate lines GW1 (see FIG. 4). Referring to FIG. 9, the first terminal connection line TL_CN_A_4 may be disposed on the same layer as that of the second gate lines GW2 (see FIG. 4).

In contrast to this, the first connection pad terminals ROW_PAD_A may be disposed on the same layer as that of the data line disposed in the display area DA. For example, the first connection pad terminal ROW_PAD_A_3 and the first connection pad terminal ROW_PAD_A_4 may be disposed on the same layer as that of the data lines DW (see FIG. 4).

Figure 10:
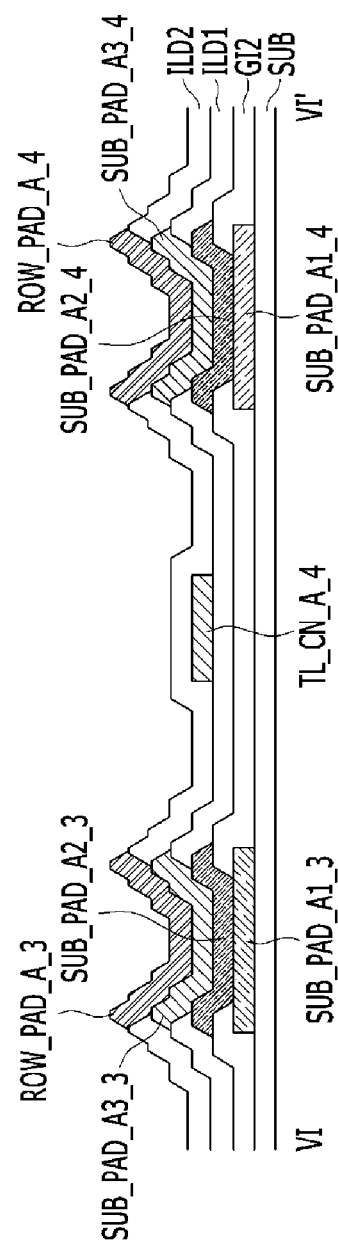
FIG. 10 is a cross-sectional view illustrating a third modified example of the first terminal connection line of FIG. 6.

Referring to FIG. 10, the first terminal connection lines TL_CN_A and the first connection pad terminals ROW_PAD_A may be formed of the data lines DW (see FIG. 4), but in this case, each of the first terminal connection lines TL_CN_A and the first connection pad terminals ROW_PAD_A may be formed of the data lines DW disposed in the different layers. More particularly, FIG. 4 illustrates that the data lines DW are disposed on the single layer, but the data lines DW may be disposed in dual layers, which are disposed in different layers with the insulating layer interposed therebetween.

In this case, each of the first terminal connection lines TL_CN_A and the first connection pad terminals ROW_PAD_A may be disposed on the same layer as that of each of the data lines of the dual layers. For example, as illustrated in FIG. 10, the fourth one of the first connection pad terminals ROW_PAD_A_4 adjacent to the third one of the first connection pad terminals ROW_PAD_A_3 may be disposed on the same layer as that of the data lines positioned at an upper side among the data lines in the dual layers, and the fourth one of the first terminal connection lines TL_CN_A_4 may be disposed on the same layer as that of the data lines positioned at a lower side among the data lines in the dual layers. That is, the first terminal connection lines TL_CN_A and the first connection pad terminals ROW_PAD_A are formed of the data lines DW (see FIG. 4), but the first terminal connection lines TL_CN_A and the first connection pad terminals ROW_PAD_A may be disposed on different layers. However, the inventive concepts are not limited thereto, and the fourth one of the first terminal connection lines TL_CN_A_4 may be formed on the same layer as that of any one of the gate lines of the dual layers.

In one or more exemplary embodiments, the first terminal connection lines TL_CN_A are positioned on the different layers as that of the first connection pad terminals ROW_PAD_A, so that it is possible to prevent the first terminal connection lines TL_CN_A and the first connection pad terminals ROW_PAD_A from being short-circuited from each other.

Accordingly, according to the exemplary embodiments, when the plurality of first connection pad terminals ROW_PAD_A and the plurality of first terminal connection lines TL_CN_A are disposed in the different layers, or the plurality of second connection pad terminals ROW_PAD_B and the plurality of first terminal connection lines TL_CN_A are disposed in the different layers, it is possible to prevent the plurality of first connection pad terminals ROW_PAD_A and the first terminal connection lines TL_CN_A, or the plurality of second connection pad terminals ROW_PAD_B and the first terminal connection lines TL_CN_A from being short-circuited from each other.

Referring to FIG. 5, first test lines TEST_LN_A may be connected to the plurality of second connection pad terminals ROW_PAD_B.

In this case, the first test line TEST_LN_A may be extended in a down direction in the second direction. In the illustrated exemplary embodiment, the first test lines TEST_LN_A may be extended up to an end portion of the substrate SUB.

Before the printed circuit board 300 is attached to the substrate SUB, first test pad terminals TEST_PAD_A may be positioned in end portions of the first test lines TEST_LN_A. That is, before the printed circuit board 300 is coupled to the substrate SUB, the first test lines TEST_LN_A and the first test pad terminals TEST_PAD_A are positioned on the substrate SUB. The first test pad terminals TEST_PAD_A may be used for examining the display panel before the printed circuit board 300 is attached to the substrate SUB. During a process of examining the display panel, a probe may be in contact with the first test pad terminals TEST_PAD_A for the examination.

A first one of the first test pad terminals TEST_PAD_A_1 may be connected to the first one of the first test lines TEST_LN_A_1, a second one of the first test pad terminals TEST_PAD_A_2 may be connected to the second one of the first test lines TEST_LN_A_2, a third one of the first test pad terminals TEST_PAD_A_3 may be connected to the third one of the first test lines TEST_LN_A_3, and the fourth one of the first test pad terminals TEST_PAD_A_4 may be connected to the fourth one of the first test lines TEST_LN_A_4.

However, when the printed circuit board 300 is attached to the substrate SUB, the first test pad terminals TEST_PAD_A are separated from the substrate SUB, so that some of the first test lines TEST_LN_A are left on the substrate SUB coupled with the printed circuit board 300.

Referring to FIG. 11, the first one of the first connection pad terminals ROW_PAD_A_1 may be disposed on the same layer as that of the first one of the first connection lines CL_A_1. That is, the first one of the first connection pad terminals ROW_PAD_A_1 may be integrally formed with the first one of the first connection lines CL_A_1. However, the inventive concepts are not limited thereto, and as illustrated in FIG. 12, the first one of the first connection pad terminals ROW_PAD_A_1 may be disposed on different layer from that of the first one of the first connection lines CL_A_1. In this case, the first one of the first connection lines CL_A_1 may be positioned under the first one of the first connection pad terminals ROW_PAD_A_1, and the first one of the first connection lines CL_A_1 may be integrally formed with a first one of the second lower pad lines SUB_PAD_B_1 positioned under the first one of the first connection pad terminals ROW_PAD_A_1.

In addition, when the gate lines disposed in the display area DA are formed of the gate lines in dual layers, the first one of the first connection lines CL_A_1 may be disposed on the same layer as that of any one of the gate lines of the dual layers.

For example, as illustrated in FIGS. 13 and 14, the first one of the first connection lines CL_A_1 may be disposed on the same layer as that of any one of the first gate lines GW1 (see FIG. 4) and the second gate lines GW2 (see FIG. 4).

Particularly, referring to FIG. 13, the first one of the second lower pad lines SUB_PAD_A2_1 and first one of the first lower pad lines SUB_PAD_A1_1 may be sequentially disposed under the first one of the first connection pad terminals ROW_PAD_A_1. In this case, the first one of the second lower pad lines SUB_PAD_A2_1 and the first one of the first lower pad lines SUB_PAD_A1_1 may be disposed on the same layers as those of the second gate lines GW2 (see FIG. 4) and the first gate lines GW1 (see FIG. 4), respectively. The first one of the first connection lines CL_A_1 may be disposed on the same layer as that of the first one of the second lower pad lines SUB_PAD_A2_1. That is, the first one of the first connection lines CL_A_1 may be integrally formed with the first one of the second lower pad lines SUB_PAD_A2_1.

Referring to FIG. 14, similar to FIG. 13, the first one of the second lower pad lines SUB_PAD_A2_1 and the first one of the first lower pad lines SUB_PAD_A1_1 may be sequentially disposed under the first one of the first connection pad terminals ROW_PAD_A_1. In this case, the first one of the first connection lines CL_A_1 may be disposed on the same layer as that of the first one of the first lower pad lines SUB_PAD_A1_1. That is, the first one of the first connection lines CL_A_1 may be integrally formed with the first one of the first lower pad lines SUB_PAD_A1_1.

Hereinafter, a structure of the second pad terminal PAD_TL_B disposed in the second terminal region TL_2 will be described in detail with reference to FIGS. 15 to 18.

Figure 15:
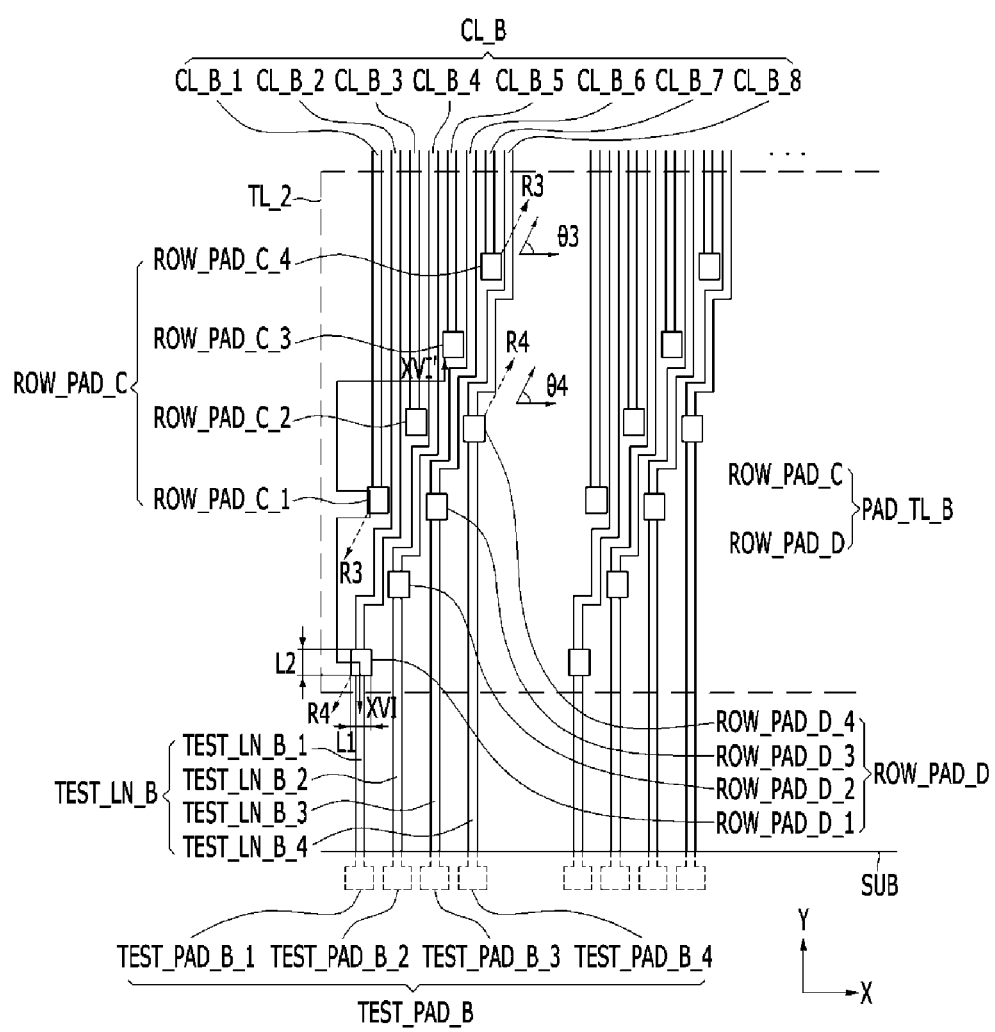
FIG. 15 is an enlarged, plan view of a second terminal region of FIG. 1.
Figure 16:
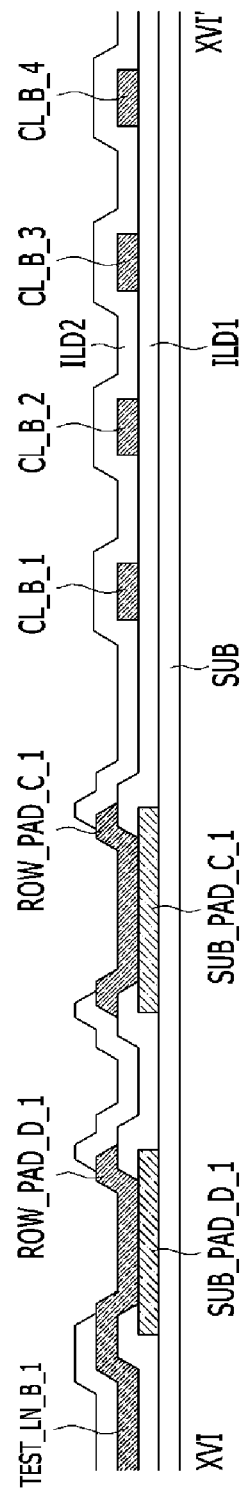
FIG. 16 is a cross-sectional view taken along line XVI-XVI' of FIG. 15.
Figure 17:
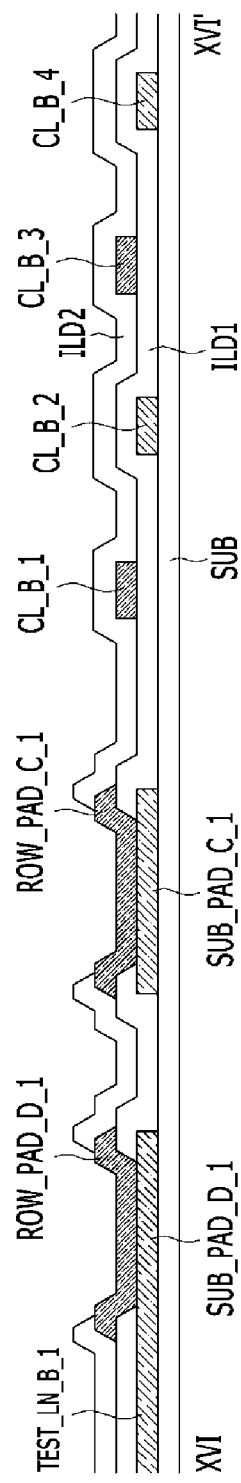
FIG. 17 is a cross-sectional view illustrating a first modified example of a second connection line of FIG. 16.
Figure 18:
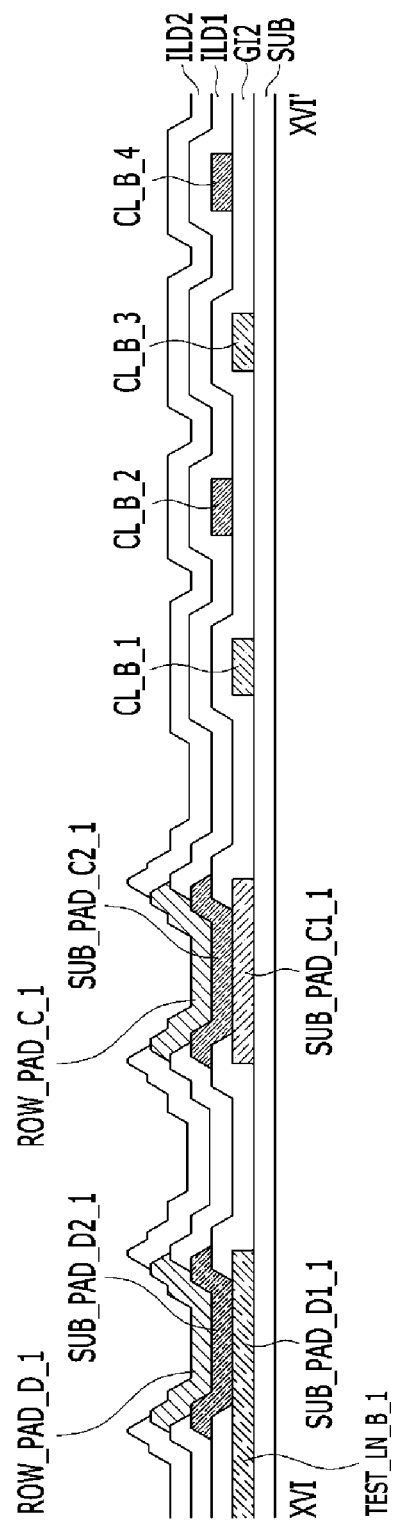
FIG. 18 is a cross-sectional view illustrating a second modified example of the second connection line of FIG. 16.

FIG. 15 is an enlarged, plan view of a second terminal region of FIG. 1, and FIG. 16 is a cross-sectional view taken along line XVI-XVI' of FIG. 15. FIG. 17 is a cross sectional view illustrating a first modified example of a second connection line of FIG. 16, and FIG. 18 is a cross sectional view illustrating a second modified example of the second connection line of FIG. 16.

Referring to FIGS. 15 and 16, the plurality of second pad terminals PAD_TL_B may be disposed in the second terminal region TL_2. In this case, the second terminal region TL_2 may be connected with the data lines DW (see FIG. 3) disposed in the display area DA through the second connection lines CL_B. The plurality of second pad terminals PAD_TL_B may be disposed within the second terminal region TL_2 while being spaced from one another with a predetermined interval in the first direction.

The plurality of second pad terminals PAD_TL_B may include a plurality of third connection pad terminals ROW_PAD_C and a plurality of fourth connection pad terminals ROW_PAD_D.

The third connection pad terminals ROW_PAD_C may be disposed while being spaced apart from one another in a predetermined direction. In this case, the third connection pad terminals ROW_PAD_C may be arranged in a third row R3 which has a third inclination angle θ3 with the first direction. That is, the third connection pad terminals ROW_

PAD_C may be arranged while being inclined at the third inclination angle θ3 with respect to the first direction. The third inclination angle θ3 may be larger than 0° and smaller than 90°.

All of the third connection pad terminals ROW_PAD_C disposed in the second terminal region TL_2 may be disposed while being inclined in the same direction. That is, the third connection pad terminals ROW_PAD_C may be disposed while being inclined at the same angle based on the first direction within the second terminal region TL_2. For example, as illustrated in FIG. 1, the third connection pad terminals ROW_PAD_C may be arranged while being inclined in the direction of approximately one o'clock based on the second direction.

However, the inventive concepts are not limited thereto, and as illustrated in FIG. 19, the plurality of third connection pad terminals ROW_PAD_C disposed in the second terminal region TL_2 may be symmetrically disposed based on a center of the second terminal region TL_2. For example, the plurality of left third connection pad terminals ROW_PAD_C based on the center of the second terminal region TL_2 may be disposed while being inclined in the direction of approximately one o'clock based on the second direction, and the plurality of right third connection pad terminals ROW_PAD_C based on the center of the second terminal region TL_2 may be disposed while being inclined in the direction of approximately eleven o'clock based on the second direction.

Intervals between the adjacent third connection pad terminals ROW_PAD_C may be the same as each other. For example, an interval between a first one of the third connection pad terminals ROW_PAD_C_1 and a second one of the third connection pad terminals ROW_PAD_C_2, an interval between the second one of the third connection pad terminals ROW_PAD_C_2 and a third one of the third connection pad terminals ROW_PAD_C_3, and an interval between the third one of the third connection pad terminals ROW_PAD_C_3 and a fourth one of the third connection pad terminals ROW_PAD_C_4 may be the same. Herein, the interval between the third connection pad terminals ROW_PAD_C represents a spaced distance in the third row R3.

The fourth connection pad terminals ROW_PAD_D may be disposed while being spaced apart from the third connection pad terminals ROW_PAD_C in the second direction. Similar to the third connection pad terminals ROW_PAD_C, the fourth connection pad terminals ROW_PAD_D may be disposed while being spaced apart from one another in a predetermined direction.

In this case, the fourth connection pad terminals ROW_PAD_D may be arranged in a fourth row R4 which has a fourth inclination angle θ4 with the first direction. That is, the fourth connection pad terminals ROW_PAD_D may be arranged while being inclined at the fourth inclination angle θ4 with respect to the first direction. The fourth inclination angle θ4 may be larger than 0° and smaller than 90°.

All of the fourth connection pad terminals ROW_PAD_D disposed in the second terminal region TL_2 may be disposed while being inclined in the same direction, similar to the third connection pad terminals ROW_PAD_C. That is, the fourth connection pad terminals ROW_PAD_D may be disposed while being inclined at the same angle based on the first direction within the second terminal region TL_2. For example, as illustrated in FIG. 1, the fourth connection pad terminals ROW_PAD_D may be arranged while being inclined in the direction of approximately one o'clock based on the second direction.

However, the inventive concepts are not limited thereto, and as illustrated in FIG. 19, the plurality of fourth connection pad terminals ROW_PAD_D disposed in the second terminal region TL_2 may be symmetrically disposed based on the center of the second terminal region TL_2. For example, the plurality of left fourth connection pad terminals ROW_PAD_D based on the center of the second terminal region TL_2 may be disposed while being inclined in the direction of approximately one o'clock based on the second direction, and the plurality of right fourth connection pad terminals ROW_PAD_D based on the center area of the second terminal region TL_2 may be disposed while being inclined in the direction of approximately eleven o'clock based on the second direction.

In the exemplary embodiments, the third inclination angle θ3 may be the same as the fourth inclination angle θ4. Accordingly, all of the third connection pad terminals ROW_PAD_C and the fourth connection pad terminals ROW_PAD_D may be arranged while being inclined at the same angle with respect to the first direction. However, the inventive concepts are not limited thereto, and the third inclination angle θ3 may be different from the fourth inclination angle θ4. That is, the third connection pad terminals ROW_PAD_C and the fourth connection pad terminals ROW_PAD_D may be arranged while being inclined at different angles with respect to the first direction.

Intervals between the adjacent fourth connection pad terminals ROW_PAD_D may be the same as each other. For example, an interval between a first one of the fourth connection pad terminals ROW_PAD_D_1 and a second one of the fourth connection pad terminals ROW_PAD_D_2, an interval between the second one of the fourth connection pad terminals ROW_PAD_D_2 and a third one of the fourth connection pad terminals ROW_PAD_D_3, and an interval between the third one of the fourth connection pad terminals ROW_PAD_D_3 and a fourth one of the fourth connection pad terminals ROW_PAD_D_4 may be the same. Here, the interval between the fourth connection pad terminals ROW_PAD_D represents a spaced distance in the fourth row R4.

In one or more exemplary embodiments, the second test lines TEST_LN_B may be connected to the plurality of fourth connection pad terminals ROW_PAD_D.

In this case, the second test line TEST_LN_B may be extended in a down direction in the second direction. In the exemplary embodiment, similar to the first test lines TEST_LN_A, the second test lines TEST_LN_B may be extended up to the end portion of the substrate SUB.

Before the printed circuit board 300 is attached to the substrate SUB, second test pad terminals TEST_PAD_B may be positioned in end portions of the second test lines TEST_LN_B. That is, before the printed circuit board 300 is coupled to the substrate SUB, the second test lines TEST_LN_B and the second test pad terminals TEST_PAD_B are positioned on the substrate SUB.

A first one of the second test pad terminals TEST_PAD_B_1 may be connected to a first one of the second test lines TEST_LN_B_1, a second one of the second test pad terminals TEST_PAD_B_2 may be connected to a second one of the second test lines TEST_LN_B_2, a third one of the second test pad terminals TEST_PAD_B_3 may be connected to a third one of the second test lines TEST_LN_B_3, and a fourth one of the second test pad terminals TEST_PAD_B_4 may be connected to a fourth one of the second test lines TEST_LN_B_4.

However, similar to the first test pad terminals TEST_PAD_B, when the printed circuit board 300 is attached to the substrate SUB, the second test pad terminals TEST_PAD_B are separated from the substrate SUB, so that some of the second test lines TEST_LN_B are left on the substrate SUB coupled with the printed circuit board 300.

Each of the third connection pad terminal ROW_PAD_C and the fourth connection pad terminal ROW_PAD_D of the second terminal region TL_2 may be connected to the second connection line CL_B. Unlike the second connection pad terminal ROW_PAD_B of FIG. 5, the fourth connection pad terminal ROW_PAD_D may be directly connected to the second connection line CL_B.

For example, a first one of the third connection pad terminals ROW_PAD_C_1 may be connected with a first one of the second connection lines CL_B_1, and a first one of the fourth connection pad terminals ROW_PAD_D_1 may be connected with a second one of the second connection lines CL_B_2. A second one of the third connection pad terminals ROW_PAD_C_2 may be connected with a third one of the second connection lines CL_B_3, and a second one the fourth connection pad terminals ROW_PAD_D_2 may be connected with a fourth one of the second connection lines CL_B_4. A third one of the third connection pad terminals ROW_PAD_C_3 may be connected with a fifth one of the second connection lines CL_B_5, and the third one of the fourth connection pad terminals ROW_PAD_D_3 may be connected with a sixth one of the second connection lines CL_B_6. A fourth one of the third connection pad terminals ROW_PAD_C_4 may be connected with a seventh one of the second connection lines CL_B_7, and a fourth one of the fourth connection pad terminals ROW_PAD_D_4 may be connected with a eighth one of the second connection lines CL_B_8.

Referring to FIG. 16, all of the second connection lines CL_B may be disposed on the same layer. For example, the adjacent first one of the second connection lines CL_B_1 and second one of the second connection lines CL_B_2 may be disposed on the same layer.

Further, the third connection pad terminal ROW_PAD_C and the fourth connection pad terminal ROW_PAD_D may also be disposed on the same layer as that of the plurality of second connection lines CL_B. For example, the first one of the third connection pad terminals ROW_PAD_C_1 and the first one of the fourth connection pad terminals ROW_PAD_D_1 may be disposed on the same layer as that of the first one of the second connection lines CL_B_1 and the second one of the second connection lines CL_B_2.

In one or more exemplary embodiments, the third connection pad terminals ROW_PAD_C, the fourth connection pad terminals ROW_PAD_D, and the plurality of second connection lines CL_B may be disposed on the same layer as that of the data lines disposed in the display area DA.

However, an interlayer structure of the plurality of second connection lines CL_B is not limited to the structure of FIG. 16, and the plurality of second connection lines CL_B may be disposed on different layers.

The second test line TEST_LN_B may be disposed on the same layer as that of the fourth connection pad terminals ROW_PAD_D. For instance, the first one of the second test lines TEST_LN_B_1 may be integrally formed with the first one of the fourth connection pad terminals ROW_PAD_D_1. The first one of the second test lines TEST_LN_B_1 may be disposed on the same layer as that of the data lines disposed in the display area DA.

Referring to FIG. 17, pairs of adjacent connection lines CL_B of the second connection lines CL_B may be disposed on different layers. For example, the adjacent first one and third one of the second connection lines CL_B_1 and CL_B_3 and second one and fourth one of the second connection lines CL_B_2 and CL_B_4 may be disposed on the different layers.

The first one and third one of the second connection lines CL_B_1 and CL_B_3 may be disposed on the same layer as that of the first one of the third one connection pad terminal ROW_PAD_C_1 and the fourth connection pad terminal ROW_PAD_D_1. On the other hand, the second one and the fourth one of the second connection lines CL_B_2 and CL_B_4 may be disposed on the same layer as that of the first one of the lower pad lines SUB_PAD_C_1 and the first one of the fourth lower pad lines SUB_PAD_D_1 positioned under the first one of the third connection pad terminals ROW_PAD_C_1 and the first one of the fourth connection pad terminals ROW_PAD_D_1. In this case, the first one of the third lower pad lines SUB_PAD_C_1 and the first one of the fourth one lower pad lines SUB_PAD_D_1 may be disposed on the same layer as that of the gate lines disposed in the display area DA. That is, the second one and fourth one of the second connection lines CL_B_2 and CL_B_4 may be disposed on the same layer as that of the gate lines, and the first one and third one of the second connection lines CL_B_1 and CL_B_3 may be disposed on the same layer as that of the data lines.

The second test line TEST_LN_B may be disposed on the same layer as that of the fourth lower pad line SUB_PAD_D. For instance, the first one of the second test lines TEST_LN_B_1 may be integrally formed with the first one of the fourth lower pad lines SUB_PAD_D_1. The first one of the second test lines TEST_LN_B_1 may be disposed on the same layer as that of the gate lines disposed in the display area DA.

Pairs of adjacent second connection lines CL_B of the second connection lines CL_B may be disposed on different layers, and further, each of the pair of adjacent second connection lines CL_B may be disposed on the same layer as that of any one of the gate lines of the dual layers.

For example, as illustrated in FIG. 18, the first one to fourth one of the second connection lines CL_B_1 to CL_B_4 may be disposed on the same layer as that of any one of the first gate lines GW1 (see FIG. 4) and the second gate lines GW2 (see FIG. 4).

Particularly, referring to FIG. 18, the lower pad line SUB_PAD_C2_1 and the lower pad line SUB_PAD_C1_1 may be sequentially disposed under the first one of the third connection pad terminals ROW_PAD_C_1. Further, the lower pad line SUB_PAD_D2_1 and the lower pad line SUB_PAD_D1_1 may be sequentially disposed under the first one of the fourth connection pad terminals ROW_PAD_D_1.

In this case, the lower pad line SUB_PAD_C2_1 and the lower pad line SUB_PAD_D2_1 may be disposed on the same layer as that of the second gate lines GW2 (see FIG. 4). The lower pad line SUB_PAD_C1_1 and the lower pad line SUB_PAD_D1_1 may be disposed on the same layer as that of the first gate lines GW1 (see FIG. 4).

The first one and the third one of the second connection lines CL_B_1 and CL_B_3 may be disposed on the same layer as that of the lower pad lines SUB_PAD_C1_1 and SUB_PAD_D1_1. The second one and fourth one of the second connection lines CL_B_2 and CL_B_4 may be disposed on the same layer as that of the lower pad lines SUB_PAD_C2_1 and SUB_PAD_D2_1.

The first one of the second test lines TEST_LN_B_1 may be disposed on the same layer as that of the first one of the lower pad lines SUB_PAD_D1_1. That is, the first one of the second test lines TEST_LN_B_1 may be integrally formed with the lower pad line SUB_PAD_D1_1.

Hereinafter, the exemplary printed circuit board 300 coupled to the display device will be described with reference to FIGS. 20 to 23.

Figure 20:
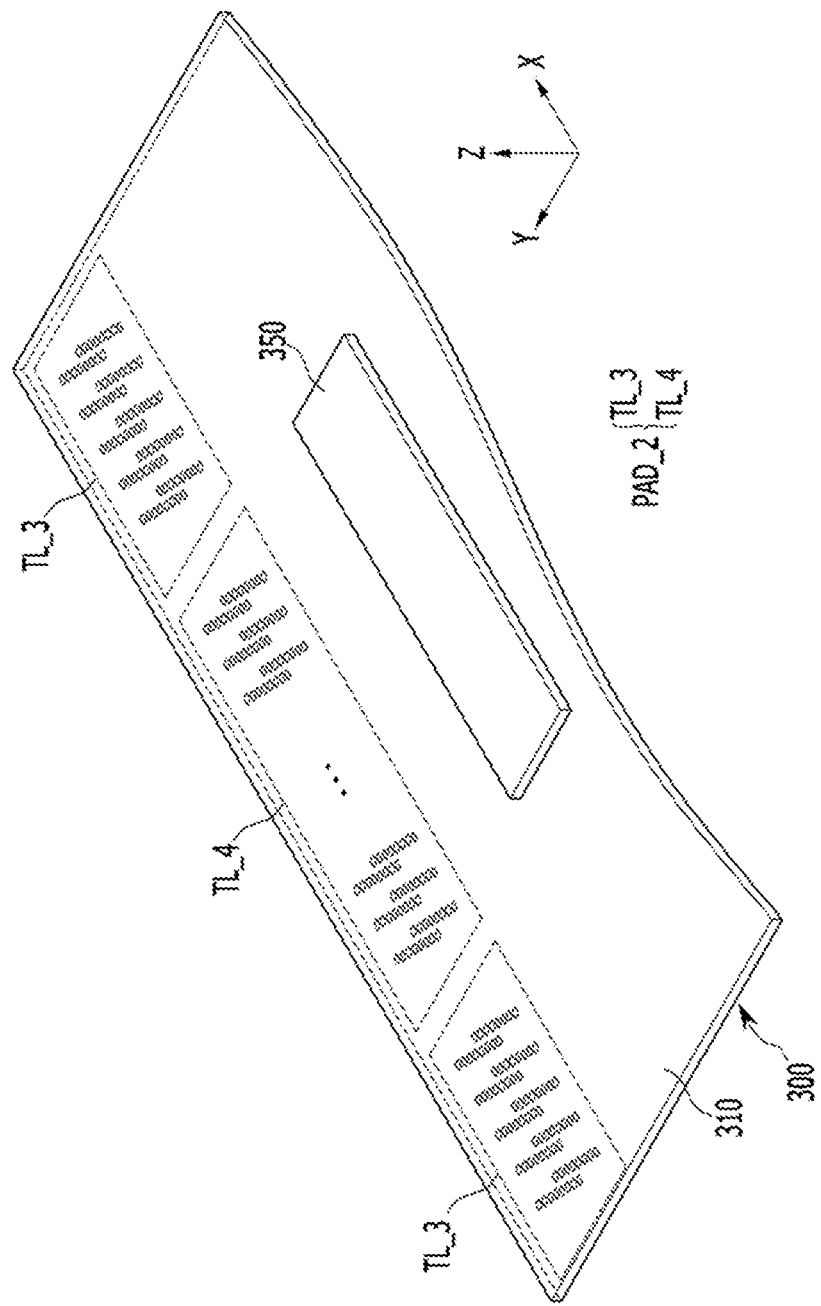
FIG. 20 is a schematic top plan view of a printed circuit board coupled to the display device of FIG. 1.
Figure 21:
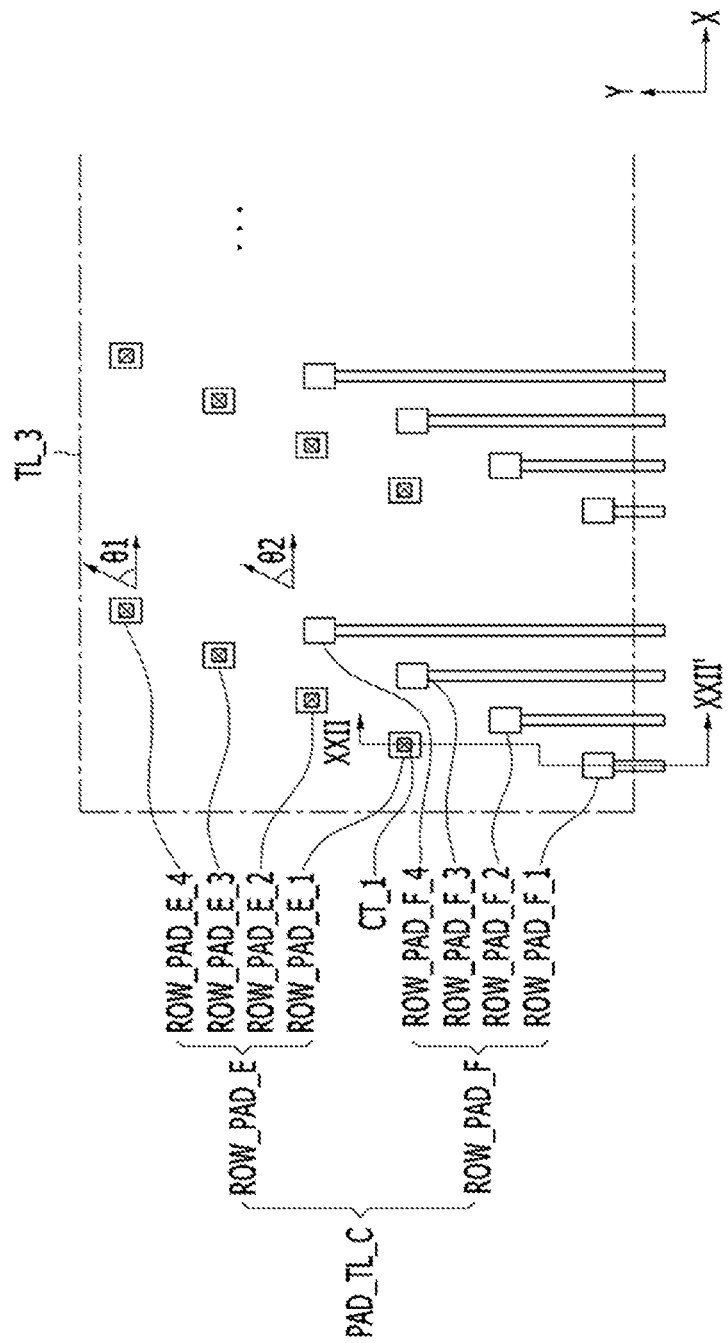
FIG. 21 is an enlarged, plan view of a third terminal region of FIG. 20.
Figure 22:
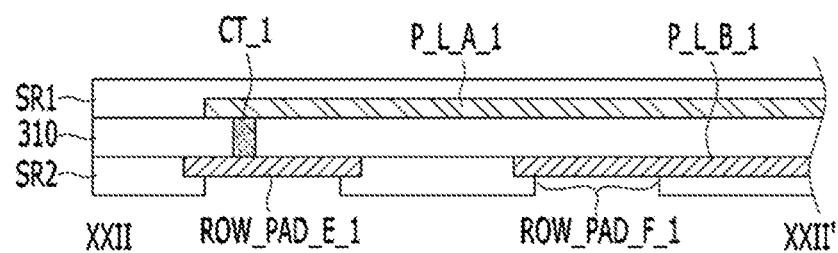
FIG. 22 is a cross-sectional view taken along line XXII-XXIII' of FIG. 21.
Figure 23:
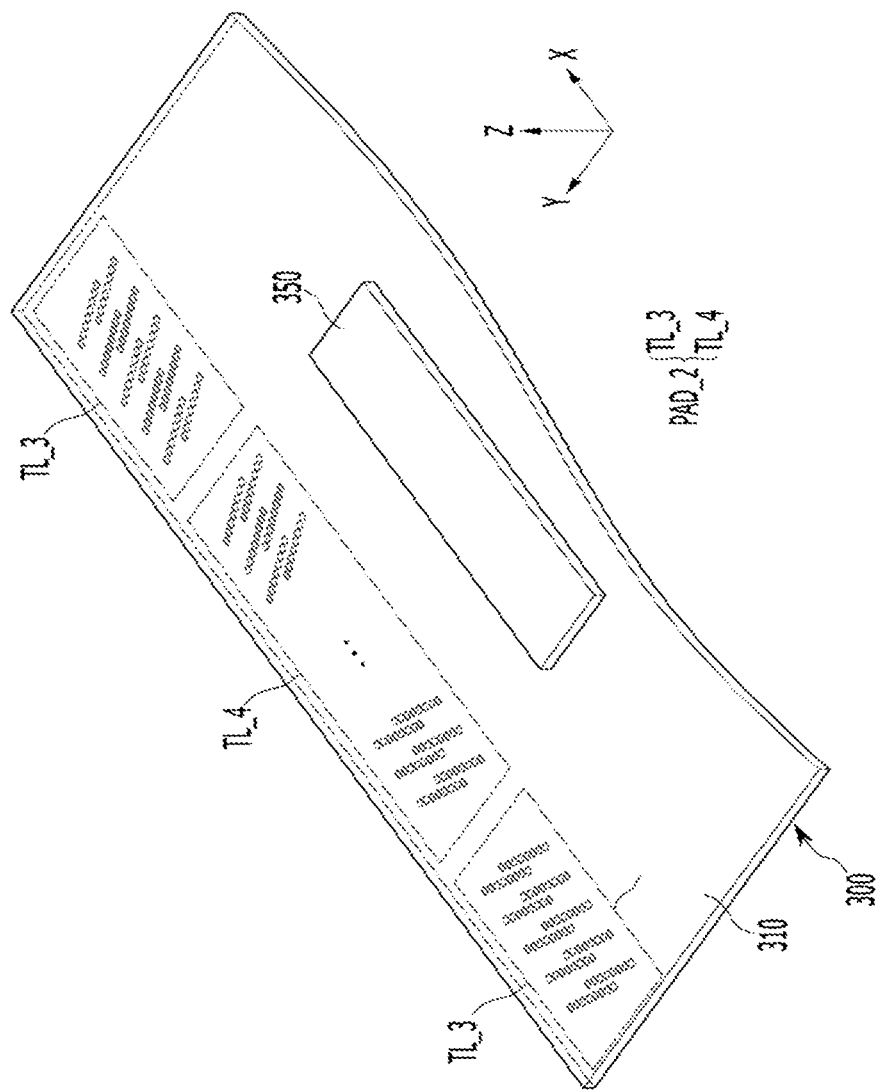
FIG. 23 is a diagram illustrating a modified example of a printed circuit board of FIG. 21.

FIG. 20 is a schematic top plan view of the printed circuit board coupled to the display device of FIG. 1, and FIG. 21 is an enlarged, plan view of the third terminal region of FIG. 20. FIG. 22 is a cross-sectional view taken along line XXII-XXII' of FIG. 21, and FIG. 23 is a diagram illustrating a modified example of the printed circuit board of FIG. 21.

Referring to FIG. 20, the printed circuit board 300 may include the base film 310, the second pad unit PAD_2, and the driving chip 350.

The second pad unit PAD_2 may be disposed at an end portion at one side of the flexible base film 310. According to the illustrated exemplary embodiment, the second pad unit PAD_2 may be formed in a shape corresponding to a shape of the first pad unit PAD_1 of the substrate SUB. The second pad unit PAD_2 of the printed circuit board 300 and the first pad unit PAD_1 of the substrate SUB are formed in corresponding shapes so that the first pad unit PAD_1 and the second pad unit PAD_2 may be easily coupled to each other.

The second pad unit PAD_2 may include the third terminal region TL_3 and the fourth terminal region TL_4. The third terminal region TL_3 and the fourth terminal region TL_4 represent regions positioned on the base film 310. The third terminal region TL_3 and the fourth terminal region TL_4 may be arranged in parallel on the base film 310 in the first direction.

According to the illustrated exemplary embodiment, the third terminal regions TL_3 may be disposed at both sides of the fourth terminal region TL_4, respectively. However, the inventive concepts are not limited thereto, and the third terminal region TL_3 may be disposed between the pair of fourth terminal regions TL_4.

However, the arrangement of the third terminal regions TL_3 and the fourth terminal regions TL_4 is determined according to the arrangement of the first terminal regions TL_1 and the second terminal regions TL_2 disposed on the substrate SUB. For example, when the second terminal regions TL_2 are disposed at both sides of the first terminal region TL_1, respectively, the fourth terminal regions TL_4 may be disposed at both sides of the third terminal region TL_3, respectively. When the second terminal region TL_2 is disposed between the pair of first terminal regions TL_1, the fourth terminal region TL_4 may be disposed between the pair of third terminal regions TL_3.

Referring to FIGS. 21 and 22, the third terminal region TL_3 is a region corresponding to the first terminal region TL_1 of the substrate SUB, and the plurality of first contact terminals PAD_TL_C may be disposed on the third terminal region TL_3.

The plurality of first contact terminals PAD_TL_C may be disposed in the same pattern as that of the first pad terminals PAD_TL_A disposed in the first terminal region TL_1.

Each of the plurality of first contact terminals PAD_TL_C may include the first contact pad terminal ROW_PAD_E and the second contact pad terminal ROW_PAD_F.

In the illustrated exemplary embodiment, the first contact pad terminals ROW_PAD_E may be disposed while being spaced apart from one another in a predetermined direction. In this case, the first contact pad terminals ROW_PAD_E may be arranged while being inclined at the first inclination angle θ1 with respect to the first direction. That is, the first contact pad terminals ROW_PAD_E may be arranged while being inclined at the same angle as that of the first connection pad terminals ROW_PAD_A of the substrate SUB. The first inclination angle θ1 may be larger than 0° and smaller than 90°.

Intervals between the adjacent first contact pad terminals ROW_PAD_E may be the same as each other. For example, an interval between a first one of the first contact pad terminals ROW_PAD_E_1 and a second one of the first contact pad terminals ROW_PAD_E_2, an interval between the second one of the first contact pad terminals ROW_PAD_E_2 and a third one of the first contact pad terminals ROW_PAD_E_3, and an interval between the third one of the first contact pad terminals ROW_PAD_E_3 and a fourth one of the first contact pad terminals ROW_PAD_E_4 may be the same. In this case, the adjacent first contact pad terminals ROW_PAD_E may be arranged with the same interval as that of the first connection pad terminals ROW_PAD_A.

The first contact pad terminals ROW_PAD_E are regions electrically contacting the first connection pad terminals ROW_PAD_A of the substrate SUB, and may approximately have a quadrangular shape.

The second contact pad terminals ROW_PAD_F may be disposed while being spaced apart from the first contact pad terminals ROW_PAD_E in the second direction. Similar to the first contact pad terminals ROW_PAD_E, the second contact pad terminals ROW_PAD_F may also be disposed while being spaced apart from one another in a predetermined direction.

In this case, the second contact pad terminals ROW_PAD_F may have the second inclination angle θ2 with the first direction. That is, the second contact pad terminals ROW_PAD_F may be arranged while being inclined at the second inclination angle θ2 with respect to the first direction. That is, the fourth connection pad terminals ROW_PAD_D may be arranged while being inclined at the same angle as that of the second connection pad terminals ROW_PAD_B of the substrate SUB. In this case, the second inclination angle θ2 may be larger than 0° and smaller than 90°.

In the exemplary embodiments, similar to the first connection pad terminal ROW_PAD_A and the second connection pad terminal ROW_PAD_B of the substrate SUB, the first inclination angle θ1 may be the same as the second inclination angle θ2. Accordingly, all of the first contact pad terminals ROW_PAD_E and the second contact pad terminals ROW_PAD_F may be arranged while being inclined at the same angle with respect to the first direction.

However, the inventive concepts are not limited thereto, and the first inclination angle θ1 may be different from the second inclination angle θ2. Accordingly, all of the first contact pad terminals ROW_PAD_E and the second contact pad terminals ROW_PAD_F may be inclined at different angles with respect to the first direction.

Intervals between the adjacent second contact pad terminals ROW_PAD_F may be the same as each other. For example, an interval between a first one of the second contact pad terminals ROW_PAD_F_1 and a second one of the second contact pad terminals ROW_PAD_F_2, an interval between the second one of the second contact pad terminals ROW_PAD_F_2 and a third one of the second contact pad terminals ROW_PAD_F_3, and an interval between the third one of the second contact pad terminals ROW_PAD_F_3 and a fourth one of the second contact pad terminals ROW_PAD_F_4 may be the same.

The second contact pad terminals ROW_PAD_F are regions electrically contacting the second connection pad terminals ROW_PAD_B of the substrate SUB, and may approximately have a quadrangular shape.

A first terminal line P_L_A_1 and a second terminal line P_L_B_1 may be positioned at both sides, that is, an upper side and a lower side, based on the base film 310 on the printed circuit board SUB. The first terminal line P_L_A_1 may be positioned on the base film 310, and the second terminal line P_L_B_1 may be positioned under the base film 310. In this case, each of the first terminal line P_L_A_1 and the second terminal line P_L_B_1 may be electrically connected with the driving chip 350.

A first passivation layer SR1 may be disposed on the first terminal line P_L_A_1 and a second passivation layer SR2 may be disposed on the second terminal line P_L_B_1. In this case, the first passivation layer SR1 and the second passivation layer SR2 may be solder resists.

The first contact pad terminal ROW_PAD_E and the second contact pad terminal ROW_PAD_F may be formed on the same layer as that of the second terminal line P_L_B_1. For instance, a part of the second passivation layer SR2 is removed and a part of the second terminal line P_L_B_1 is exposed, so that the first one of the first contact pad terminals ROW_PAD_E_1 and the first one of the second contact pad terminals ROW_PAD_F_1 may be formed. In this case, the first one of the first contact pad terminals ROW_PAD_E_1 is spaced apart from the first one of the second contact pad terminals ROW_PAD_F_1.

In this case, the first one of the first contact pad terminals ROW_PAD_E_1 may be electrically connected with the first terminal line P_L_A_1 through a first contact hole CT_1 formed in the base film 310. When viewed on a plane, the first contact hole CT_1 may be disposed while overlapping the first one of the first contact pad terminals ROW_PAD_E_1. In this case, the first contact hole CT_1 may be filled with the same metal as that of the first terminal line P_L_A_1, or may be filled with the metal of the first one of the first contact pad terminals ROW_PAD_E_1.

The first one of the second contact pad terminals ROW_PAD_F_1 may be formed on the same metal layer as that of the second terminal line P_L_B_1. In the exemplary embodiment, the first one of the second contact pad terminals ROW_PAD_F_1 may correspond to an exposed region of a part of the second terminal line P_L_B_1.

Referring to FIG. 20, the fourth terminal region TL_4 is a region corresponding to the second terminal region TL_2 of the substrate SUB, and the plurality of second contact terminals (not illustrated) may be disposed on the fourth terminal region TL_4.

The plurality of second contact terminals (not illustrated) may be disposed in the same pattern as that of the second pad terminals PAD_TL_B disposed in the second terminal region TL_2. In this case, the plurality of second contact terminals (not illustrated) may include a similar structure as that of the plurality of first contact terminals PAD_TL_C.

In FIG. 20, all of the first contact terminals and the second contact terminals disposed in the third terminal region TL_3 and the fourth terminal region TL_4 may be disposed while being inclined at the same angle with respect to the first direction. For example, the first contact terminals and the second contact terminals may be disposed while being inclined in the direction of approximately one o'clock.

However, in the modified example of the printed circuit board of FIG. 23, the first contact terminals and the second contact terminals may be disposed in the pattern corresponding to the first pad terminals PAD_TL_A and the second pad terminals PAD_TL_B of the first terminal region TL_1 and the second terminal region TL_2 described above with reference to FIG. 19. That is, the first contact terminal PAD_TL_C positioned at a left side of the fourth terminal region TL_4 may be disposed while being inclined in the direction of approximately one o'clock based on the second direction, and the first contact terminal PAD_TL_C positioned at a right side of the fourth terminal region TL_4 may be disposed while being inclined in the direction of approximately eleven o'clock based on the second direction.

The plurality of second contact terminals disposed in the fourth terminal region TL_4 may be symmetrically disposed based on a center of the fourth terminal region TL_4. For example, the plurality of left second contact terminals based on the center of the fourth terminal region TL_4 may be disposed while being inclined in the direction of approximately one o'clock based on the second direction, and the plurality of right second contact terminals based on the center of the fourth terminal region TL_4 may be disposed while being inclined in the direction of approximately eleven o'clock based on the second direction.

Hereinafter, a coupled state of the first terminal region TL_1 and the third terminal region TL_3 will be described in detail with reference to FIGS. 24 and 25.

Figure 24:
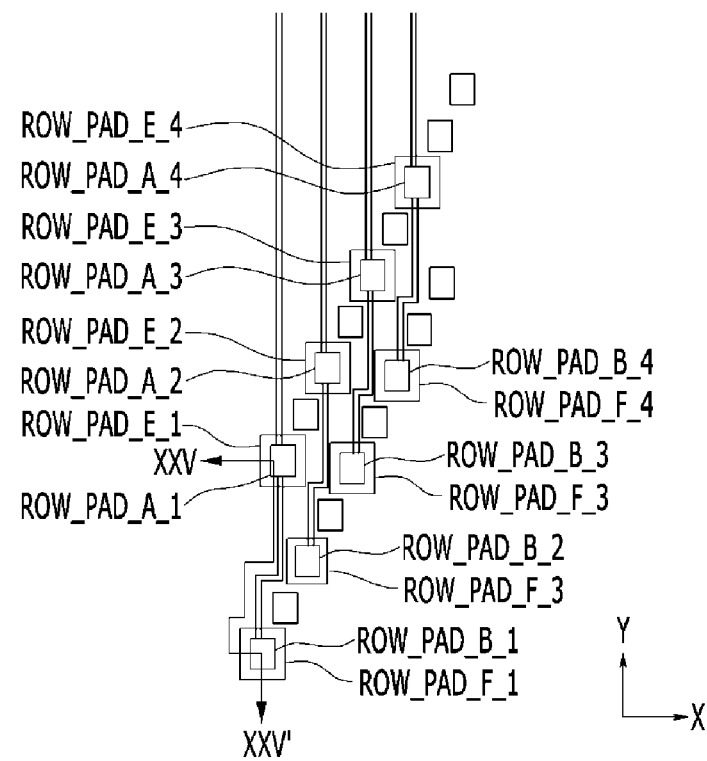
FIG. 24 is a diagram schematically illustrating a state where a first terminal region formed in a substrate is coupled to a third terminal region formed in the printed circuit board.
Figure 25:
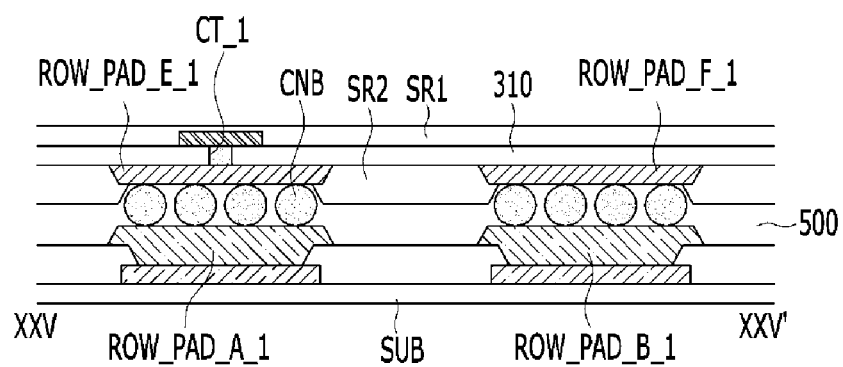
FIG. 25 is a cross-sectional view taken along line XXV-XXV' of FIG. 24.

FIG. 24 is a diagram schematically illustrating a state where the first terminal region formed in the substrate is coupled to the third terminal region formed in the printed circuit board, and FIG. 25 is a cross-sectional view taken along line XXV-XXV' of FIG. 24.

The first contact terminals PAD_TL_C (see FIG. 21) may be disposed while overlapping the first pad terminals PAD_TL_A (see FIG. 5) on cross-sections of the first pad terminals PAD_TL_A (see FIG. 5). More particularly, the first contact pad terminals ROW_PAD_E may overlap on cross-sections of the first connection pad terminals ROW_PAD_A, and the second contact pad terminals ROW_PAD_F may overlap on the second connection pad terminals ROW_PAD_B.

Further, a conductive attachment film 500 may be disposed between the first terminal region TL_1 and the third terminal region TL_3. The conductive attachment film 500 may electrically connect the first connection pad terminals ROW_PAD_A and the first contact pad terminals ROW_PAD_E. Further, the conductive attachment film 500 may electrically connect the second connection pad terminals ROW_PAD_B and the second contact pad terminals ROW_PAD_F. The first connection pad terminals ROW_PAD_A may be electrically connected with the first contact pad terminals ROW_PAD_E through a plurality of conductive balls CNB included in the conductive attachment film 500. Further, the second connection pad terminals ROW_PAD_B may be electrically connected with the second contact pad terminals ROW_PAD_F.

In the exemplary display devices, each of the first pad terminals PAD_TL_A (see FIG. 5) includes the plurality of first connection pad terminals ROW_PAD_A, the plurality of second connection pad terminals ROW_PAD_B, and the first terminal connection lines TL_CN_A, and the first terminal connection lines TL_CN_A electrically connecting the first connection pad terminal ROW_PAD_A, and the second connection pad terminal ROW_PAD_B may be disposed on a different layer from that of the first connection pad terminals ROW_PAD_A and the second connection pad terminals ROW_PAD_B.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A display device, comprising:
a substrate including a display area to display an image and a pad area positioned around the display area;
a first pad unit disposed on the pad area, and including a first terminal region having a plurality of first pad terminals arranged in a first direction; and
a printed circuit board including a base film and a second pad unit positioned at one side of the base film, the second pad unit being coupled with the first pad unit by electrically connecting with the plurality of first pad terminals;
wherein each of the plurality of first pad terminals includes:
at least three first connection pad terminals arranged in a first row disposed at a first angle larger than 0° and smaller than 90° relative to the first direction, the plurality of first connection pad terminals electrically connecting with the second pad unit of the printed circuit board through a plurality of conductive balls;
a plurality of second connection pad terminals spaced apart from the plurality of first connection pad terminals, and arranged in a second row disposed at a second angle larger than 0° and smaller than 90° relative to the first direction, the plurality of second connection pad terminals electrically connecting with the second pad unit of the printed circuit board through another plurality of conductive balls;
a plurality of first dummy pad terminals disposed between pairs of adjacent first connection pad terminals of the first connection pad terminals,
a plurality of first terminal connection lines configured to connect one of the plurality of first connection pad terminals and one of the plurality of second connection pad terminals, and having at least one bent shape, and
wherein the plurality of first dummy pad terminals are arranged in the first row disposed at the first angle.

2. The display device of claim 1, wherein:
a first one of the first dummy pad terminals is disposed between a first one of the first connection pad terminals and a second one of the first connection pad terminals, and
a second one of the first dummy pad terminals is disposed between the second one of the first connection pad terminals and a third one of the first connection pad terminals.

3. The display device of claim 2, wherein:
the first connection pad terminals and the first dummy pad terminals are arranged to be parallel to one another, and
the first connection pad terminals and the first dummy pad terminals are serially arranged along the first row.

4. The display device of claim 2, wherein:
the first dummy pad terminals are floated without receiving a signal.

5. The display device of claim 1, further comprising:
a plurality of second dummy pad terminals disposed between pairs of adjacent second connection pad terminals of the second connection pad terminals,
wherein the plurality of second dummy pad terminals are arranged in the second row disposed at the second angle.

6. The display device of claim 5, wherein:
a first one of the second dummy pad terminals is disposed between a first one of the second connection pad terminals and a second one of the second connection pad terminals, and
a second one of the second dummy pad terminals is disposed between the second one of the second connection pad terminals and a third one of the second connection pad terminals.

7. The display device of claim 6, wherein:
the second connection pad terminals and the second dummy pad terminals are arranged to be parallel to one another, and
the second connection pad terminals and the second dummy pad terminals are serially arranged along the second row.

8. The display device of claim 6, wherein:
the second dummy pad terminals are floated without receiving a signal.

9. The display device of claim 1, wherein:
the first angle is substantially same as the second angle.

10. The display device of claim 1, wherein:
the first pad unit further includes a second terminal region having a plurality of second pad terminals spaced apart from the first terminal region.

11. The display device of claim 10, wherein:
each of the plurality of second pad terminals includes:
a plurality of third connection pad terminals arranged in a third row disposed at a third angle relative to the first direction; and
a plurality of fourth connection pad terminals spaced apart from the plurality of third connection pad terminals, and arranged in a fourth row disposed at a fourth angle relative to the first direction.

12. The display device of claim 11, wherein:
the third angle is substantially same as the fourth angle.

13. The display device of claim 12 wherein:
each of the third angle and the fourth angle is larger than 0° and smaller than 90°.

14. The display device of claim 11, wherein:
the third angle is substantially same as the first angle.

15. The display device of claim 11, further comprising:
a plurality of second test lines connected to the plurality of fourth connection pad terminals, respectively, and extending to an end portion of one side of the substrate.

16. The display device of claim 1, wherein:
each of the plurality of first connection pad terminals and the plurality of second connection pad terminals has a plate-like, quadrangular shape.

17. The display device of claim 16, wherein:
the quadrangular shape is defined at least in part by a first side parallel to the first direction, and a second side adjacent to the first side and parallel to a second direction crossing the first direction, and
the second side is longer than the first side.

18. The display device of claim 1, wherein the second pad unit has a shape substantially corresponding to that of the first pad unit and, includes a plurality of first contact terminals coupled with the plurality of first pad terminals, and
each of the plurality of first contact terminals includes:
a plurality of first contact pad terminals arranged in a fifth row disposed at the first angle relative to the first direction; and
a plurality of second contact pad terminals spaced apart from the plurality of first contact pad terminals, and arranged in a sixth row disposed at the second angle relative to the first direction.

19. The display device of claim 18, wherein:
the printed circuit board further includes a plurality of first terminal lines disposed on the base film, and
the plurality of first terminal lines are electrically connected with the plurality of first contact pad terminals disposed under the base film by a plurality of first contact holes passing through the base film.

20. The display device of claim 19, wherein:
the plurality of first contact holes overlap the plurality of first contact pad terminals, respectively.

21. A display device, comprising:
a substrate including a display area to display an image and a pad area positioned around the display area;
a first pad unit disposed on the pad area, and including a first terminal region having a plurality of first pad terminals arranged in a first direction; and
a printed circuit board including a base film and a second pad unit positioned at one side of the base film, the second pad unit being coupled with the first pad unit by electrically connecting with the plurality of first pad terminals;
wherein each of the plurality of first pad terminals includes:
at least three first connection pad terminals arranged in a first row disposed at a first angle larger than 0° and smaller than 90° relative to the first direction, the plurality of first connection pad terminals electrically connecting with the second pad unit of the printed circuit board through a plurality of conductive balls;
a plurality of second connection pad terminals spaced apart from the plurality of first connection pad terminals, and arranged in a second row disposed at an angle larger than 0° and smaller than 90° relative to the first direction, the plurality of second connection pad terminals electrically connecting with the second pad unit of the printed circuit board through another plurality of conductive balls;
a plurality of first dummy pad terminals disposed between pairs of adjacent first connection pad terminals of the first connection pad terminals; and
a plurality of first terminal connection lines configured to connect one of the plurality of first connection pad terminals and one of the plurality of second connection pad terminals, and having at least one bent shape,
wherein the first terminal connection line is disposed in a different layer from that of the first connection pad terminal and the second connection pad terminal.

22. The display device of claim 21, wherein:
a plurality of data lines and a plurality of gate lines crossing the plurality of data lines are disposed in the display area of the substrate.

23. The display device of claim 22, wherein:
at least one of the plurality of first connection pad terminals and the plurality of second connection pad terminals are disposed in a same layer as that of the plurality of data lines, and
the plurality of first terminal connection lines are disposed in a same layer as that of the plurality of gate lines.

24. The display device of claim 23, wherein:
the plurality of gate lines include a plurality of first gate members and a plurality of second gate members disposed on the plurality of first gate members, and
the plurality of first terminal connection lines are disposed in a same layer as that of any one of the plurality of first gate members and the plurality of second gate members.

25. The display device of claim 22, further comprising:
a plurality of first connection lines disposed in the pad area to connect the display area and the plurality of first connection pad terminals.

26. The display device of claim 25, wherein:
the plurality of first connection lines are disposed in a same layer as that of the plurality of data lines.

27. The display device of claim 25, wherein:
the plurality of first connection lines are disposed in a same layer as that of the plurality of gate lines.

28. The display device of claim 27, wherein:
the plurality of gate lines include a plurality of first gate members and a plurality of second gate members disposed on the plurality of first gate members, and
the plurality of first connection lines are disposed in a same layer as that of any one of the plurality of first gate members and the plurality of second gate members.

29. The display device of claim 22, further comprising:
a plurality of first test lines connected to the plurality of second connection pad terminals, respectively, and extending to an end portion of one side of the substrate.

30. The display device of claim 29, wherein:
the plurality of first test lines are disposed in a same layer as that of the plurality of data lines.

31. The display device of claim 29, wherein:
the plurality of first test lines are disposed in a same layer as that of the plurality of gate lines.

32. The display device of claim 31, wherein:
the plurality of gate lines include a plurality of first gate members and a plurality of second gate members disposed on the plurality of first gate members, and
the plurality of first test lines are disposed in a same layer as that of any one of the plurality of first gate members and the plurality of second gate members.

* * * * *